United States Patent
Chung et al.

(10) Patent No.: US 12,376,286 B2
(45) Date of Patent: Jul. 29, 2025

(54) VERTICAL NON-VOLATILE MEMORY DEVICES HAVING A MULTI-STACK STRUCTURE WITH ENHANCED PHOTOLITHOGRAPHIC ALIGNMENT CHARACTERISTICS

(71) Applicant: Samsung Electronics Co., Ltd., Suwon-si (KR)

(72) Inventors: Giyong Chung, Seoul (KR); Youngjin Kwon, Gwacheon-si (KR); Dongseog Eun, Seongnam-si (KR)

(73) Assignee: SAMSUNG ELECTRONICS CO., LTD., Suwon-si (KR)

( * ) Notice: Subject to any disclaimer, the term of this patent is extended or adjusted under 35 U.S.C. 154(b) by 0 days.

(21) Appl. No.: 18/402,144

(22) Filed: Jan. 2, 2024

(65) Prior Publication Data

US 2024/0138141 A1      Apr. 25, 2024

Related U.S. Application Data

(63) Continuation of application No. 17/469,469, filed on Sep. 8, 2021, now Pat. No. 11,895,827.

(30) Foreign Application Priority Data

Dec. 22, 2020   (KR) ........................ 10-2020-0181182

(51) Int. Cl.
*H10B 12/00*      (2023.01)

(52) U.S. Cl.
CPC ....... *H10B 12/395* (2023.02); *H10B 12/0383* (2023.02); *H10B 12/50* (2023.02)

(58) Field of Classification Search
CPC .. H10B 12/395; H10B 12/0383; H10B 12/50; H10B 41/27; H10B 43/27; H10B 43/50;
(Continued)

(56) References Cited

U.S. PATENT DOCUMENTS 6,958,281 B2      10/2005   Kwon
9,691,782 B1 *    6/2017    Hwang ................ H10D 89/811
(Continued)

FOREIGN PATENT DOCUMENTS

KR      100518244 B1         10/2005
KR      20100129544 A *      12/2010
(Continued)

*Primary Examiner* — Edward Chin
(74) *Attorney, Agent, or Firm* — Myers Bigel, P.A.

(57) ABSTRACT

A vertical-type nonvolatile memory device has a multi-stack structure with reduced susceptibility to mis-alignment of a vertical channel layer. This nonvolatile memory device includes: (i) a main chip area including a cell area and an extension area arranged to have a stepped structure, with the cell area and the extension area formed in a multi-stack structure, and (ii) an outer chip area, which surrounds the main chip area and includes a step key therein. The main chip area includes a first layer on a substrate and a second layer on the first layer. A lower vertical channel layer is arranged in the first layer. The step key includes an alignment vertical channel layer, and a top surface of the alignment vertical channel layer is lower than a top surface of the lower vertical channel layer.

20 Claims, 21 Drawing Sheets

(58) Field of Classification Search
CPC ........ H10B 41/50; H10B 41/41; H10B 41/35;
H10B 43/35; H10B 43/40; H10B 43/10;
H10B 41/42; H10B 41/40; G11C 11/005;
G11C 16/0483; H01L 21/78; H01L
23/544
See application file for complete search history.

(56) References Cited

U.S. PATENT DOCUMENTS

| | | | |
|---|---|---|---|
| 9,748,257 B2 * | 8/2017 | Lee | H10B 43/50 |
| 10,418,374 B2 | 9/2019 | Lee et al. | |
| 10,720,396 B2 | 7/2020 | Roh | |
| 2016/0322381 A1 * | 11/2016 | Liu | H10D 64/035 |
| 2017/0062455 A1 * | 3/2017 | Nomura | H10B 43/27 |
| 2021/0028058 A1 * | 1/2021 | Kim | H01L 21/76802 |

FOREIGN PATENT DOCUMENTS

| | | |
|---|---|---|
| KR | 20140063145 A | 5/2014 |
| KR | 20160069596 A | 6/2016 |
| KR | 20190061362 A | 6/2019 |

* cited by examiner

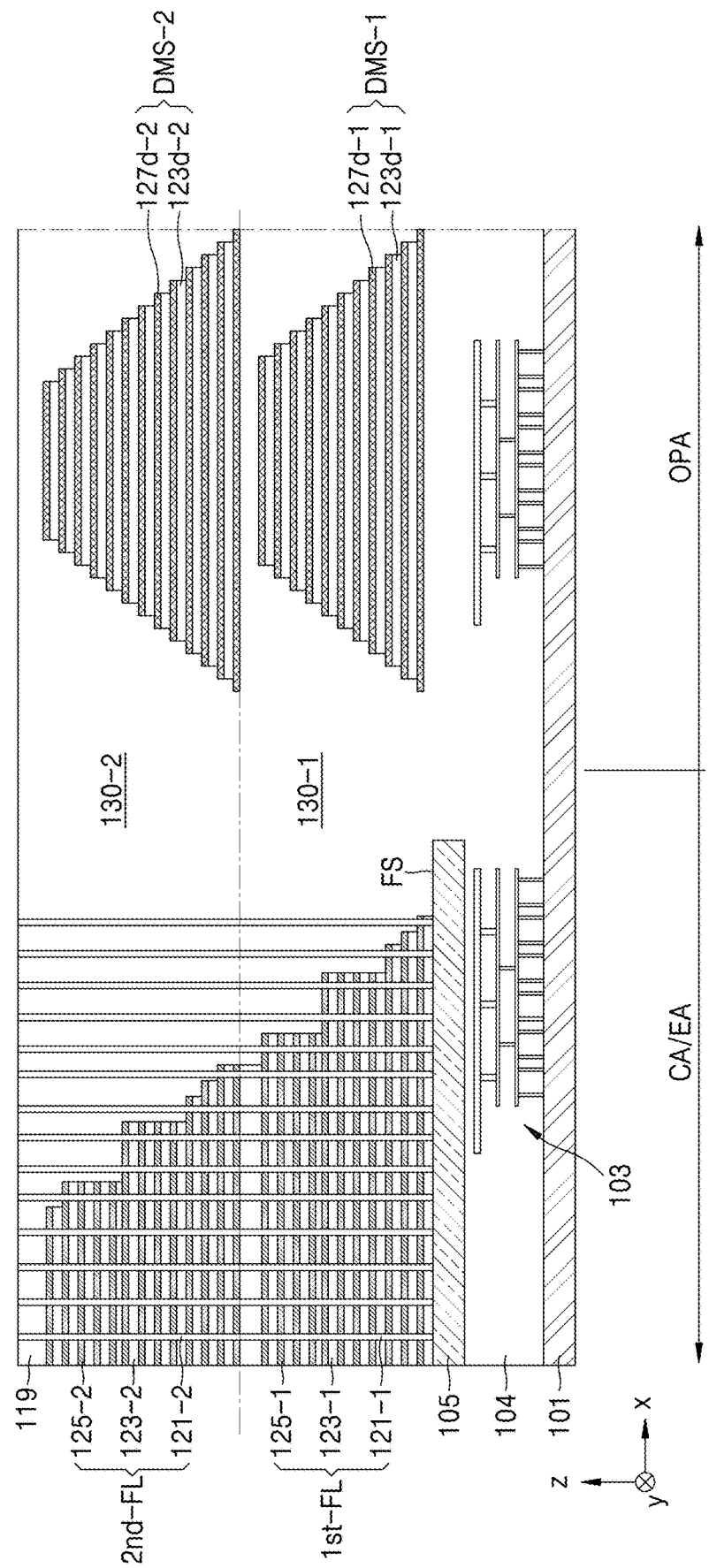

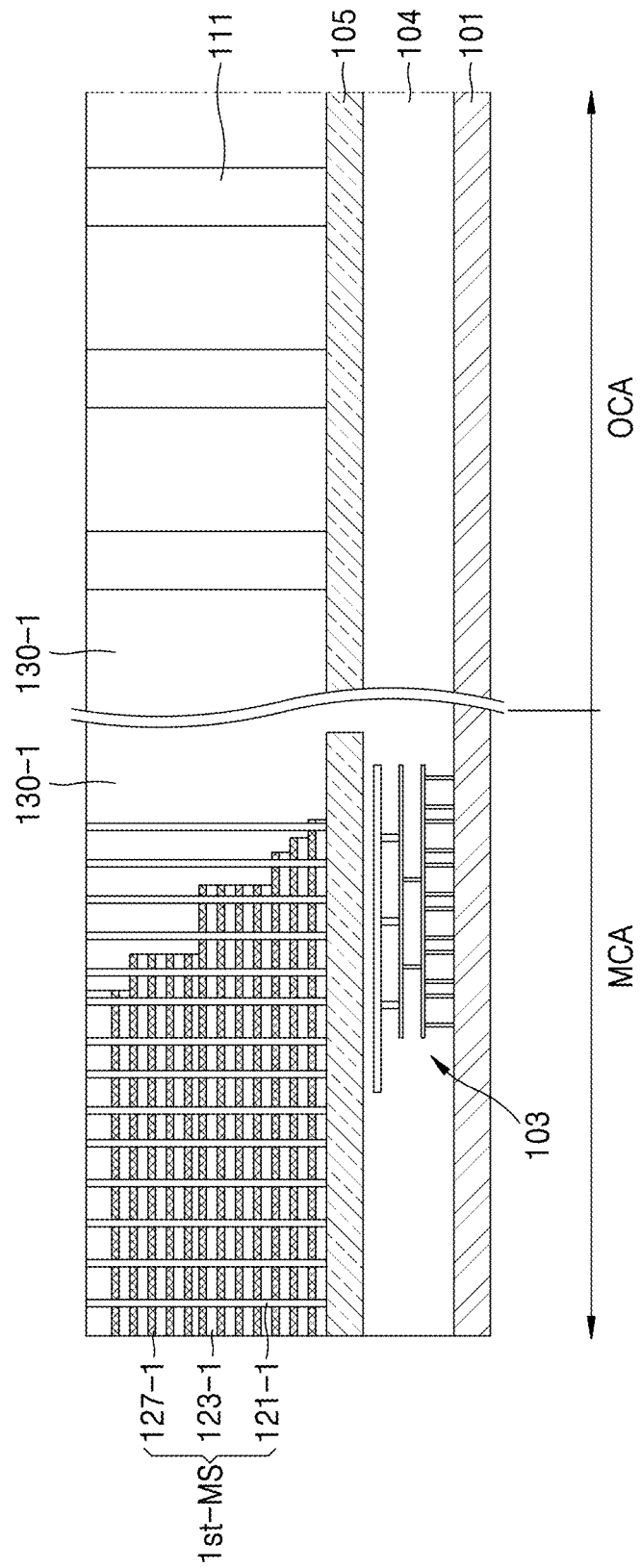

VERTICAL NON-VOLATILE MEMORY DEVICES HAVING A MULTI-STACK STRUCTURE WITH ENHANCED PHOTOLITHOGRAPHIC ALIGNMENT CHARACTERISTICS

REFERENCE TO PRIORITY APPLICATION

This U.S. non-provisional patent application is a continuation of and claims priority to U.S. patent application Ser. No. 17/469,469, filed on Sep. 8, 2021, which itself claims priority under 35 U.S.C. § 119 to Korean Patent Application No. 10-2020-0181182, filed Dec. 22, 2020, the disclosures of both of which are hereby incorporated herein by reference.

BACKGROUND

The inventive concept relates to nonvolatile memory devices, and more particularly, to nonvolatile memory devices having vertical type channel structures that support higher memory cell integration.

The numbers of devices and systems using nonvolatile memory elements have been on the increase in recent years. For example, MP3 players, digital cameras, mobile phones, camcorders, flash cards, and solid state disks (SSDs) use higher capacity nonvolatile memories as storage devices. Because, among nonvolatile memories, flash memory has a function of collectively electrically erasing cell data, the flash memory is widely used as a storage device instead of a hard disk. With the recent trend of increasing storage capacity, a method of efficiently using a storage space of a flash memory is required. Thus, a nonvolatile memory device having a vertical transistor structure instead of a planar transistor structure (i.e., a three-dimensional (3D) vertical type nonvolatile memory device) have been proposed.

SUMMARY

The inventive concept provides a vertical type nonvolatile memory device having a multi-stack structure in which misalignment of a vertical channel layer is minimized so that reliability of the vertical type nonvolatile memory device may be enhanced.

According to an aspect of the inventive concept, there is provided a vertical type nonvolatile memory device having a main chip area, which includes a cell area and an extension area extending from the cell area in a first direction and arranged to have a stepped structure. The cell area and the extension area are formed in a multi-stack structure. An outer chip area is also provided, which surrounds the main chip area and includes a step key therein. The main chip area includes a first layer arranged on a substrate and a second layer stacked on the first layer. A lower vertical channel layer connected to the substrate is arranged on the first layer, and the step key includes an alignment vertical channel layer corresponding to the lower vertical channel layer, and a top surface of the alignment vertical channel layer is lower than a top surface of the lower vertical channel layer.

According to another aspect of the inventive concept, there is provided a vertical type nonvolatile memory device including a substrate, a cell area in which a plurality of cells are arranged on the substrate, an extension area extending from the cell area in a first direction and arranged to have a stepped structure on the substrate, and an outer area, which is adjacent to the extension area in the first direction and adjacent to the cell area in a second direction perpendicular to the first direction on the substrate and in which a step key used in alignment of a vertical channel layer is arranged. Each of the cell area and the extension area includes a first layer on the substrate and a second layer on the first layer. The vertical channel layer includes a first vertical channel layer arranged on the first layer and a second vertical channel layer arranged on (and vertically aligned to) the second layer. The step key includes an alignment vertical channel layer corresponding to the first vertical channel layer. A top surface of the alignment vertical channel layer is lower than a top surface of the first vertical channel layer.

According to another aspect of the inventive concept, there is provided a vertical type nonvolatile memory device including a main chip area including a cell area and an extension area extending from the cell area in a first direction and arranged to have a stepped structure. The cell area and the extension area are formed in a multi-stack structure. And, an outer chip area is provided, which surrounds the main chip area and includes a first portion of a step key used in alignment of a vertical channel layer. The main chip area includes a first layer arranged on a substrate and a second layer on the first layer. The vertical channel layer includes a first vertical channel layer arranged on the first layer and a second vertical channel layer arranged on the second layer. The first portion of the step key includes an alignment vertical channel layer corresponding to the first vertical channel layer. A top surface of the alignment vertical channel layer is lower than a top surface of the first vertical channel layer.

According to a further aspect of the inventive concept, a nonvolatile memory device is provided, which includes a substrate having a main chip area thereon. The main chip area includes a first memory cell layer and second memory cell layer, which is stacked on the first memory cell layer. The first memory cell layer includes a first vertical channel layer, a first interlayer insulating layer, and a first gate electrode layer. The second memory cell layer includes a second vertical channel layer vertically aligned with the first vertical channel layer, a second interlayer insulating layer, and a second gate electrode layer. An outer chip area is also provided on the substrate. This outer chip area at least partially surrounds the main chip area, and includes a step key therein. The step key includes an alignment vertical channel layer, which is formed concurrently with the first vertical channel layer. The alignment vertical channel layer has a top surface that is recessed relative to a top surface of the first vertical channel layer after the first vertical channel layer is formed. An electrically insulating layer is also provided on the second memory cell layer. In addition, a mold structure is provided on the alignment vertical channel layer. The mold structure has a contoured upper surface that: (i) meets an upper surface of the electrically insulating layer, and (ii) sufficiently replicates a contoured upper surface of the outer chip area caused, at least in part, by the recessed top surface of the alignment vertical channel layer. Based on this replication of the contoured upper surface of the outer chip area, the contoured upper surface of the mold structure can be used to support photolithographic alignment of the second vertical channel layer to the first vertical channel layer when channel layer holes are etched through the electrically insulating layer, the second interlayer insulating layer, and the second gate electrode layer.

According to yet another aspect of the inventive concept, a nonvolatile memory device is provided, which includes a substrate having a main chip area thereon. The main chip area includes a first memory cell layer and second memory cell layer stacked on the first memory cell layer. The first memory cell layer includes a first vertical channel layer, a first interlayer insulating layer, and a first gate electrode layer. The second memory cell layer includes a second vertical channel layer vertically aligned with the first vertical channel layer, a second interlayer insulating layer, and a second gate electrode layer. An outer chip area is provided on the substrate, and this outer chip area at least partially surrounds the main chip area. This outer chip area includes a first photolithographic alignment key therein, which comprises an alignment vertical channel layer with a top surface that is recessed relative to a top surface of the first vertical channel layer. A mold structure is provided on the alignment vertical channel layer. The mold structure has a contoured upper surface thereon, which sufficiently replicates upper surface contours of the first photolithographic alignment key that the contoured upper surface operates as a second photolithographic alignment key during formation of the second vertical channel layer.

BRIEF DESCRIPTION OF THE DRAWINGS

Embodiments of the inventive concept will be more clearly understood from the following detailed description taken in conjunction with the accompanying drawings in which:

FIGS. 6A through 6C are a plan view and cross-sectional views of a vertical type nonvolatile memory device having a multi-stack structure according to example embodiments;

FIGS. 7A through 7E are cross-sectional views showing a method of manufacturing the vertical type nonvolatile memory device of FIG. 2;

DETAILED DESCRIPTION OF THE EMBODIMENTS

Figure 1:
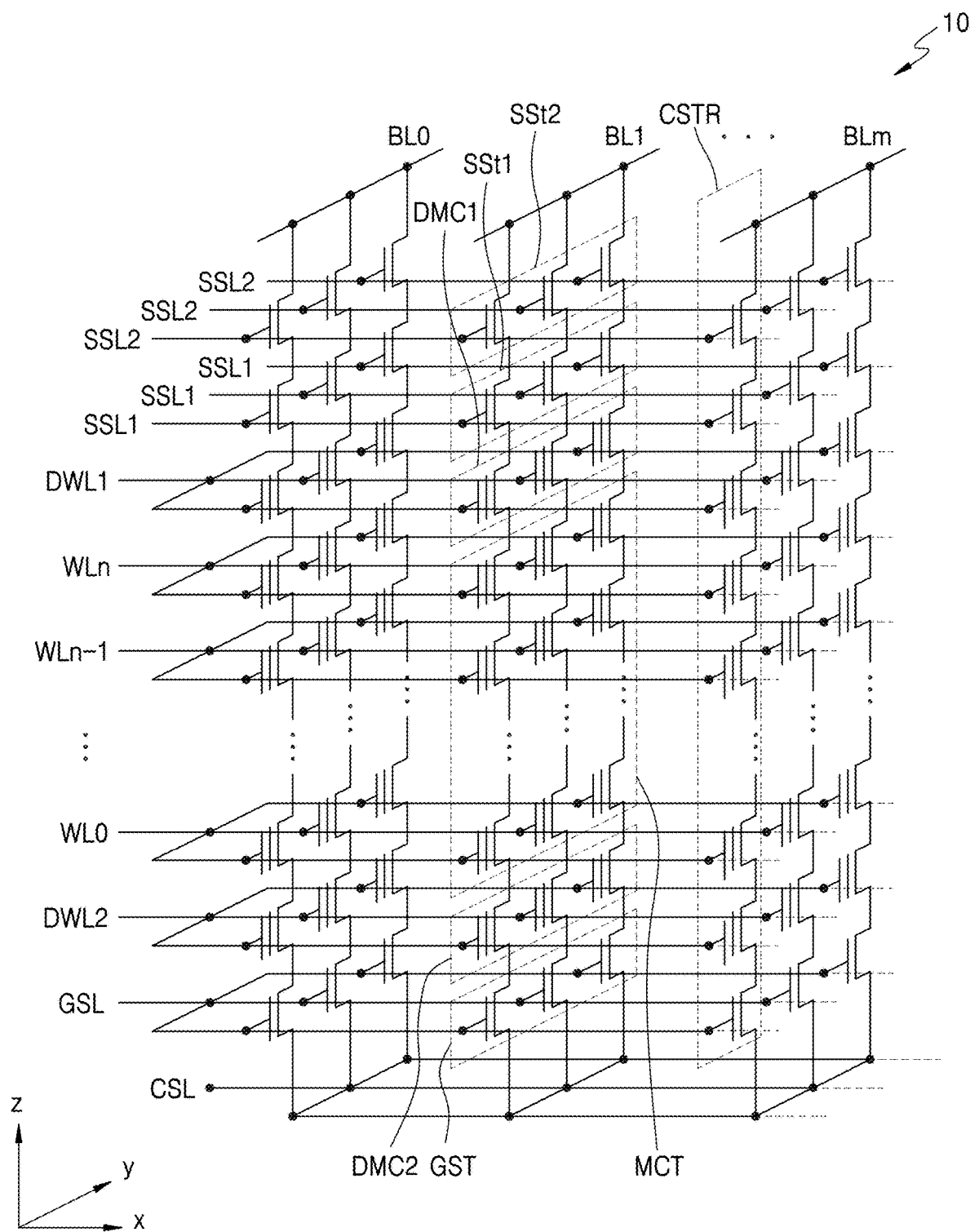
FIG. 1 is an equivalent circuit diagram of a memory cell array of a vertical type nonvolatile memory device according to an example embodiment.

Hereinafter, embodiments of the inventive concept will be described in detail with reference to the accompanying drawings. The same reference numerals are used for like components in the drawings, and redundant descriptions thereof will be omitted.

FIG. 1 is an equivalent circuit diagram of a memory cell array of a vertical type nonvolatile memory device according to an example embodiment. Referring to FIG. 1, a vertical type nonvolatile memory device 10 according to the present embodiment may include a common source line CSL, a plurality of bit lines BL0 to BLm, and a plurality of NAND-type cell strings CSTR. The bit lines BL0 to BLm may be arranged two-dimensionally, and the plurality of cell strings CSTR may be connected in parallel to each of the bit lines BL0 to BLm. The plurality of cell strings CSTR may be commonly connected to the common source line CSL.

Each of the cell strings CSTR may include string selection transistors SST1 and SST2, memory cell transistors MCT, and a ground selection transistor GST. Each of the memory cell transistors MCT may include a data storage element. In detail, the first and second string selection transistors SST1 and SST2 may be connected in series to each other, and the second string selection transistor SST2 may be connected to a corresponding bit line, and the ground selection transistor GST may be connected to the common source line CSL. Also, gate electrodes of the first and second string selection transistors SST1 and SST2 may be connected to the string selection lines SSL1 and SSL2, and a gate electrode of the ground selection transistor GST may be connected to a ground selection line GSL.

The memory cell transistors MCT may be connected in series between the first string selection transistor SST1 and the ground selection transistor GST. According to an embodiment, one string selection transistor may be arranged in each of the cell strings CSTR. As shown in FIG. 1, each of the cell strings CSTR may include a first dummy cell transistor DMC1 connected between the first string selection transistor SST1 and the memory cell transistor MCT and a second dummy cell transistor DMC2 connected between the ground selection transistor GST and the memory cell transistor MCT. However, according to some embodiments, at least one of the first and second dummy cell transistors DMC1 and DMC2 may be omitted.

Because one cell string CSTR includes a plurality of memory cell transistors MCT having different distances from the common source lines CSL, multi-layered word lines WL0 to WLn may be arranged between the common source lines CSL and the bit lines BL0 to BLm. Also, gate electrodes of the memory cell transistors MCT arranged at substantially the same distance from the common source lines CSL may be commonly connected to one among the word lines WL0 to WLn to be in an equipotential state.

The vertical type nonvolatile memory device 10 according to the present embodiment may be formed through a multi-stack process. That is, the vertical type nonvolatile memory device 10 according to the present embodiment may have a multi-stack structure. Here, the multi-stack process may refer to a process in which, as the number of layers of the vertical type nonvolatile memory device 10 increases, the height in a vertical direction increases and it is gradually more difficult to form channel holes penetrating all the way, without interruption, to a substrate. So, a mold structure is divided two or more times and the channel holes are formed in each of the mold structures.

Also, the vertical type nonvolatile memory device 10 according to the present embodiment may include a main chip region (see MCA of FIG. 2A) and an outer chip area (see OCA of FIG. 2A), and a step key (see 110 of FIGS. 2A and 2B) may be present in the outer chip area OCA. Advantageously, the step key 110 may be used to facilitate alignment of the channel holes in a first "lower" vertical channel layer (see 121-1 of FIG. 2B) of a lower mold structure when corresponding channel holes for a second "upper" vertical channel layer (see 121-2 of FIG. 2B) are formed in an upper mold structure. In the vertical type nonvolatile memory device 10 according to the present embodiment, the step key 110 may include an alignment vertical channel layer (see 111 of FIG. 2B) corresponding to the first vertical channel layer 121-1, and a top surface of the alignment vertical channel layer 111 may be lower than a top surface of the first vertical channel layer 121-1 by a first depth (see D1 of FIG. 2C). The alignment vertical channel layer 111, the first vertical channel layer 121-1 and the second vertical channel layer 121-2 may be formed as respective semiconductor layers (e.g., polysilicon).

In the vertical type nonvolatile memory device 10 according to the present embodiment, the alignment vertical channel layer 111 of the step key 110 is formed lower than the first vertical channel layer 121-1 so that a curve corresponding to the shape of the step key 110 may be maintained on a top surface of a mold structure (see MS of FIG. 2B) arranged on the step key 110 without being greatly affected by a planarization process. Thus, the channel holes for the second vertical channel layer 121-2 may be precisely aligned with the first vertical channel layer 121-1 by using the step key 110 and the curve on the top surface of the mold structure MS to guide photolithographic alignment. As such, mis-alignment on a vertical channel layer may be effectively prevented, and the vertical type nonvolatile memory device having reliability may be implemented. The step key 110 and alignment of the vertical channel layers 121-1 and 121-2 using the step key 110 will be described in more detail in the description of FIGS. 3A through 3C.

Figure 2A:
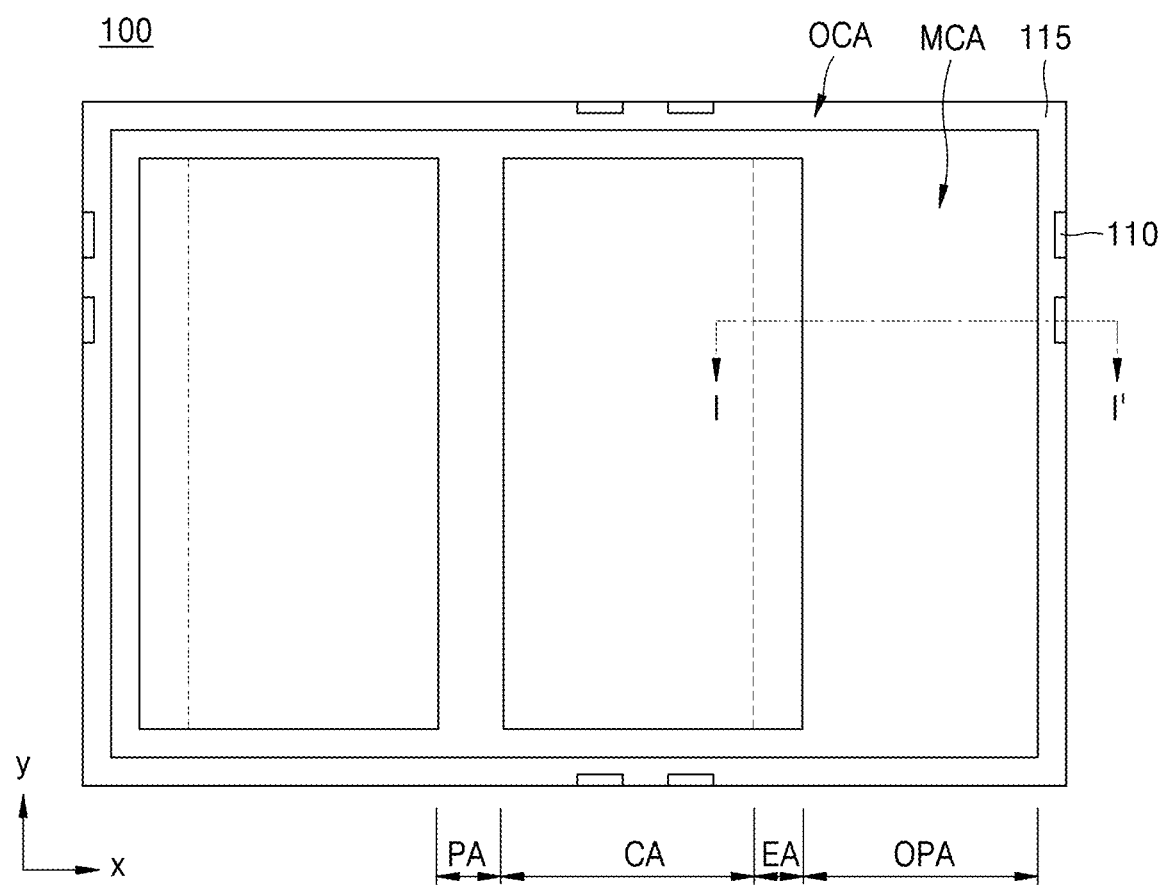
FIGS. 2A through 2C are a plan view and cross-sectional views of a vertical type nonvolatile memory device having a multi-stack structure according to an example embodiment.
Figure 2B:
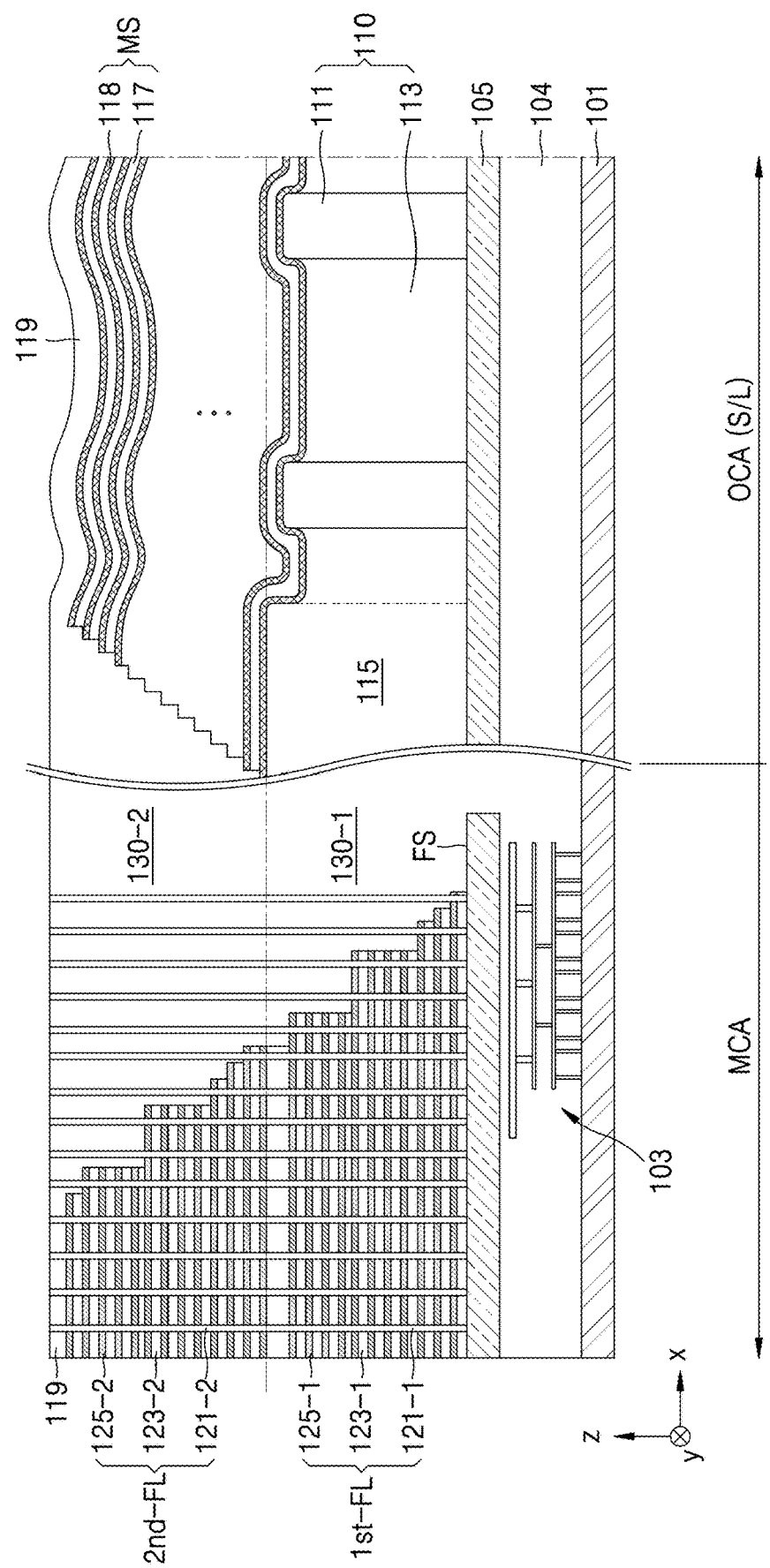
Figure 2C:
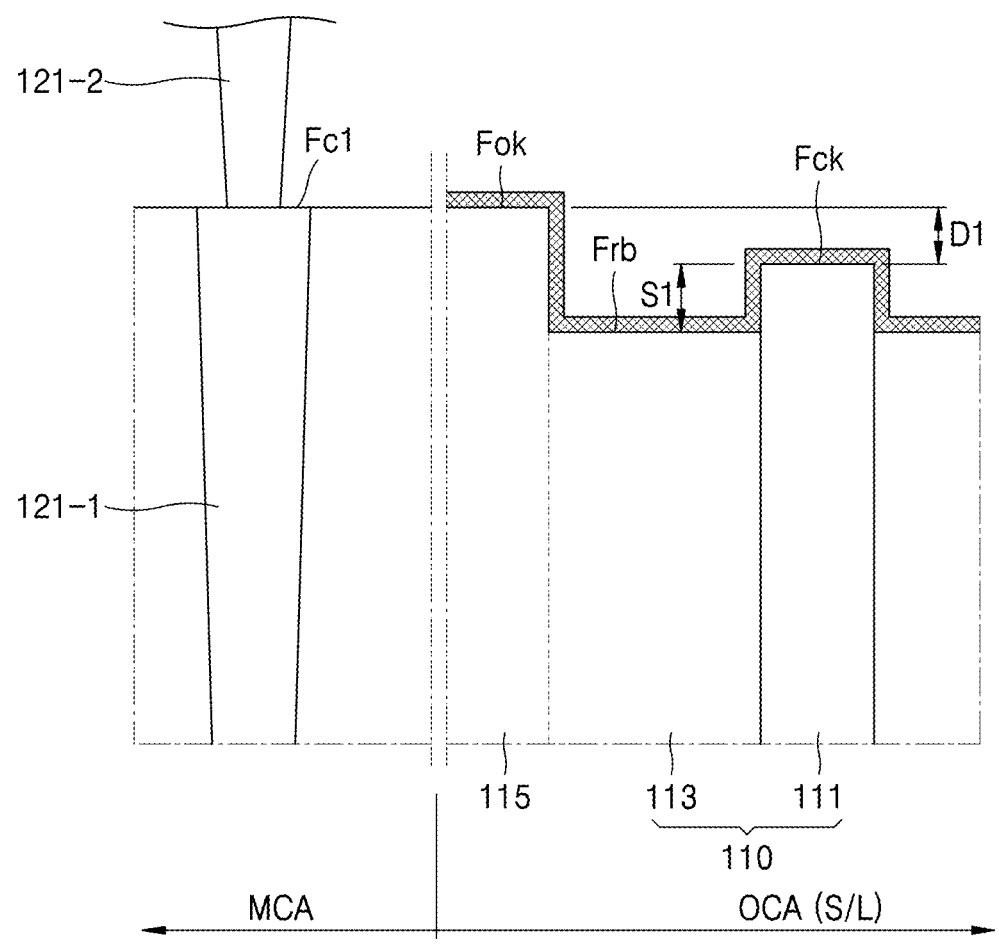

FIGS. 2A through 2C are a plan view and cross-sectional views of a vertical type nonvolatile memory device having a multi-stack structure according to an embodiment, wherein FIG. 2B is a cross-sectional view taken along portion I-I' of FIG. 2A, and FIG. 2C is an enlarged cross-sectional view of a portion of the vertical channel layer and the step key of FIG. 2B. FIGS. 2A through 2C will be described with reference to FIG. 1 together.

Referring to FIGS. 2A through 2C, a vertical type nonvolatile memory device 100 (hereinafter, referred to as a 'memory device') having a multi-stack structure according to the present embodiment may include a main chip area MCA and an outer chip area OCA on an upper substrate 105. The main chip area MCA may include a cell area CA, an extension area EA, a peri area PA, and an outer peri area OPA.

The upper substrate 105 may have a top surface FS that extends in a first direction (x-direction) and a second direction (y-direction). The upper substrate 105 may be formed of polysilicon, for example. The material of the upper substrate 105 is not limited to polysilicon. For example, the upper substrate 105 may be formed of an IV-group semiconductor material, an III-V-group compound semiconductor material, or an II-VI-group oxide semiconductor material. The upper substrate 105 may not be present in at least a portion of the outer peri area OPA.

The cell area CA may be an area in which string selection transistors SST1 and SST2, the memory cell transistor MCT and the ground selection transistor GST that constitute the cell strings described in FIG. 1 are arranged. The plurality of bit lines BL0 to BLm may be arranged on an upper portion of the cell area CA, and impurity areas and common source lines CSL may be arranged on a lower portion of the cell area CA. As shown in FIG. 2B, the cell area CA may include a first layer 1st-FL and a second layer 2nd-FL. The first layer 1st-FL may include a first vertical channel layer 121-1, a first interlayer insulating layer 123-1, and a first gate electrode layer 125-1. The first vertical channel layer 121-1 may extend from the upper substrate 105 in a third direction (z-direction), and the first interlayer insulating layer 123-1 and the first gate electrode layer 125-1 may be alternately stacked while surrounding the first vertical channel layer 121-1. Also, the second layer 2nd-FL may include a second vertical channel layer 121-2, a second interlayer insulating layer 123-2, and a second gate electrode layer 125-2, the second vertical channel layer 121-2 may extend from the first vertical channel layer 121-1 in the third direction (z-direction), and the second interlayer insulating layer 123-2 and the second gate electrode layer 125-2 may be alternately stacked while surrounding the second vertical channel layer 121-2. The gate electrode layers 125-1 and 125-2 may correspond to gate electrodes of the string selection transistors SST1 and SST2, the memory cell transistor MCT, and the ground selection transistor GST of FIG. 1.

Each of the first vertical channel layer 121-1 and the second vertical channel layer 121-2 may include a semiconductor layer, a data storage layer, and a buried insulating layer. The semiconductor layer may be connected to the upper substrate 105. According to an embodiment, a pillar-shaped epitaxial layer grown from the upper substrate 105 may be formed between the semiconductor layer and the upper substrate 105. An inside of the semiconductor layer may be filled with the buried insulating layer. According to an embodiment, the buried insulating layer may be omitted, and only the semiconductor layer may be arranged. The data storage layer may extend in the third direction (z-direction) and may surround sidewalls of the semiconductor layer. Thus, the data storage layer may be arranged between the gate electrode layers 125-1 and 125-2 and the semiconductor layer and between the interlayer insulating layers 123-1 and 123-2 and the semiconductor layer. The data storage layer may include one thin layer or a plurality of thin layers. In the memory device 100 according to the present embodiment, the data storage layer that is a data storage layer for a NAND flash memory device may include a tunnel insulating layer, a charge storage layer, and a blocking insulating layer. For example, the memory device 100 according to the present embodiment may be a NAND flash memory device. The semiconductor layer may penetrate into the data storage layer and may be electrically connected to the upper substrate 105.

The extension area EA may be an area in which an electrode pads formed by extending the gate electrode layers 125-1 and 125-2 of the cell area CA in the first direction (x-direction) are arranged. In the extension area EA, the electrode pad may be connected to a vertical contact. As can be seen from FIG. 2B, the electrode pad may be formed in a stepped structure in the extension area EA. The extension area EA may also include the first layer 1st-FL and the second layer 2nd-FL. The first layer 1st-FL may include a first vertical channel layer 121-1, a first interlayer insulating layer 123-1, and a pad electrode, and the second layer 2nd-FL may include a second vertical channel layer 121-2, a second interlayer insulating layer 123-2, and a pad electrode.

For reference, the vertical channel layers 121-1 and 121-2 arranged in the extension area EA may be dummy channel layers that do not function electrically and may function to support a mold structure in a replacement process into the gate electrode layers 125-1 and 125-2. According to an embodiment, the vertical channel layers 121-1 and 121-2 in the extension area EA may be omitted. In the extension area EA, only at least a portion of the vertical channel layers 121-1 and 121-2 may be surrounded by the interlayer insulating layers 123-1 and 123-2 and the pad electrode, and the rest thereof may be surrounded by insulating structures 130-1 and 130-2. The insulating structures 130-1 and 130-2 may include a first insulating structure 130-1 and a second insulating structure 130-2 in correspondence with the first layer 1st-FL and the second layer 2nd-FL. However, because the first insulating structure 130-1 and the second insulating structure 130-2 are formed of the same material, they may not be substantially distinguished from each other. As can be seen through FIG. 2B, in the extension area EA, some of the second vertical channel layers 121-2 may be surrounded only by the second insulating structure 130-2.

Separation areas may be arranged in the cell area CA and the extension area EA. The separation areas may extend in the first direction (x-direction) and may be arranged in the second direction (y-direction) at certain intervals. By the separation areas, the cell area CA and the extension area EA may be apart from each other in block units in the second direction (y-direction). Also, a replacement process into the gate electrode layers 125-1 and 125-2 may be performed by using the separation areas. The separation area is also called a word line cut area.

A flat insulating layer 119 may cover a top surface of the second layer 2nd-FL of the cell area CA and the extension area EA. The flat insulating layer 119 may have a substantially flat top surface. Also, the flat insulating layer 119 may constitute a portion of the second insulating structure 130-2 in the extension area EA. The flat insulating layer 119 may include one insulating layer or a plurality of insulating layers. A bit line electrode pad, a sub bit line, and a bit line may be sequentially arranged on the second layer 2nd-FL and connected to the vertical channel layers 121-1 and 121-2. The bit line electrode pad and the sub bit line and the sub bit line and the bit lie may be connected to each other via a contact plug that extends in the third direction (z-direction). In FIG. 2B, for convenience, the bit line electrode pad, the sub bit line, and the bit line above the flat insulating layer 119, and an insulating layer and a contact plug therebetween may be omitted, and only the flat insulating layer 119 is shown.

The outer peri area OPA may be arranged adjacent in the first direction (x-direction) in the extension area EA. The extension area EA may be arranged in each of the cell area CA, as indicated by dotted lines in FIG. 2A. On the other hand, the outer peri area OPA may be arranged adjacent to one of the extension areas EA. Through-vias, for example, may be arranged in the outer peri area OPA. Also, intermediate wirings connected to wirings of the cell area CA and/or the extension area EA may be arranged in the outer peri area OPA. Wirings in the cell area CA and/or the extension area EA may be connected to a peripheral circuit 103 below the upper substrate 105 via the through vias and the intermediate wirings of the outer peri area OPA. The structure of the outer peri area OPA will be described in more detail in the description of FIGS. 6A through 6C.

As shown in FIG. 2B, the peripheral circuit 103 may be arranged below the upper substrate 105. In other words, the memory device 100 according to the present embodiment may have a structure in which the cell area CA is stacked at the upper portion of the peripheral circuit 103, for example, a cell on peri (COP) structure. The peripheral circuit 103 may be formed on a lower substrate 101. The lower substrate 101 may include a semiconductor material, for example, an IV-group semiconductor, an III-V-group compound semiconductor, or an II-VI-group oxide semiconductor. In the memory device 100 according to the present embodiment, the lower substrate 101 may be formed based on monocrystalline silicon wafer, for example. An n-well region into which n-type impurities are doped, a p-well region into which p-type impurities are doped, may be formed in the lower substrate 101, and active regions may be defined by a device isolation layer in the n-well region and the p-well region.

The peripheral circuit 103 may include a high voltage and/or low voltage transistor and a passive element such as a resistor or capacitor. Also, the peripheral circuit 103 may include wirings connected to the transistor and the passive element. A lower interlayer insulating layer 104 may be arranged on the lower substrate 101 to cover the transistor, the passive element, and the wirings. As described above, the wirings in the cell area CA and/or the extension area EA may be connected to wirings of the peripheral circuit 103 via the through-vias in the outer peri area OPA. According to an embodiment, the through-vias may be arranged in a portion of the cell area CA and/or the extension area EA, or in the peri area PA adjacent to the cell area CA.

As described above, the upper substrate 105 may be formed of polysilicon. For example, a trench region for a substrate may be formed in an upper portion of the lower interlayer insulating layer 104, and the upper substrate 105 may be formed by filling the trench region with polysilicon. In this way, when the upper substrate 105 is formed of polysilicon, a peripheral circuit 103 and the lower interlayer insulating layer 104 may be formed on the lower substrate 101, and the upper substrate 105 may be formed at the upper portion of the lower interlayer insulating layer 104. Subsequently, the cell area CA and the extension area EA may be formed on the upper substrate 105, and a through-via may be formed in the outer peri area OPA, thereby realizing a memory device having a COP structure.

The outer chip area OCA may have a structure surrounding the main chip area MCA. For example, when the main chip area MCA has a rectangular shape, the outer chip area OCA may have a rectangular ring shape surrounding the main chip area MCA. The outer chip area OCA may correspond to a portion where, when the memory device 100 according to the present embodiment is separated from a wafer state through sawing, a scribe lane S/L of a wafer remains after sawing.

The outer chip area OCA may include the step key 110 and a key outer area 115. The step key 110 may include the alignment vertical channel layer 111 and a recessed portion 113. The alignment vertical channel layer 111 may be formed together when the first vertical channel layer 121-1 of the main chip area MCA is formed. However, the height of the alignment vertical channel layer 111 may be different from the height of the first vertical channel layer 121-1. That is, as shown in FIG. 2C, a top surface Fck of the alignment vertical channel layer 111 may be lower than a top surface Fc1 of the first vertical channel layer 121-1 by a first depth D1. For example, the first depth D1 may be 400 Å to 800 Å. The first depth D1 is not limited to the above value. The first depth D1 will be described in more detail in the description of FIGS. 5A and 5B.

The first vertical channel layer 121-1 and the alignment vertical channel layer 111 may be different in shape and size. For example, the first vertical channel layer 121-1 has a cylindrical shape with a diameter of about several hundred nm, whereas the alignment vertical channel layer 111 may have a rectangular pillar shape with a width of about several μm. For reference, in FIG. 2C, the main chip area MAC and the outer chip area OCA are shown in different scale. The first vertical channel layer 121-1 and the second vertical channel layer 121-2 may have a tapered shape of which diameter decreases downward. Thus, at a portion where the first vertical channel layer 121-1 and the second vertical channel layer 121-2 meet, the top surface Fc1 of the first vertical channel layer 121-1 may be wider than a bottom surface of the second vertical channel layer 121-2. Thus, a portion of the top surface Fc1 of the first vertical channel layer 121-1 may be exposed. The shape and size of the alignment vertical channel layer 111 will be described in more detail in the description of FIGS. 3A through 3C.

In the step key 110, the recessed portion 113 may be formed between alignment vertical channel layers 111, and a bottom surface Frb of the recessed portion 113 may be lower than the top surface Fck of the alignment vertical channel layer 111 by a first step S1. The first step S1 may have a height of about several hundred nm to several micrometers (μm). The height of the first step S1 is not limited to the above-described value. The top surface Fok of the key outer area 115 outside the step key 110 may be higher than the top surface Fck of the alignment vertical channel layer 111 and may also have a substantially the same height as the top surface Fc1 of the first vertical channel layer 121-1. Thus, the top surface Fck of the alignment vertical channel layer 111 may be lower than the top surface Fok of the key outer area 115 by the first depth D1.

Although not shown, various types of keys may be arranged in the outer chip area OCA in addition to the step key 110. For example, an alignment key, a Test Element Group (TEG), an overlay key, Back End Of Site (BEOS), Oxide Site (OS), Optical CD (OCD), and the like may be arranged in the outer chip area OCA. Here, the alignment key may refer to an alignment key generally used in a photolithography process, and TEG may be a pattern for testing a manufacturing process of a semiconductor device and characteristics of a completed semiconductor device, and the overlay key may be a pattern for measuring an alignment state between a layer formed in the previous process and a layer formed in a current process. Also, BEOS may be a pattern for measuring the thickness of an uppermost layer after a chemical mechanical polishing (CMP) process, and OS may be a pattern for measuring the thickness of an outermost layer similar to BEOS, and in some cases, BEOS may replace OS. OCD may be a pattern for measuring the thickness of a CD or an inner side by an optical method. Keys formed in the outer chip area OCA are not limited to the above-described keys.

A mold structure MS may be arranged on the step key 110. The mold structure MS may include a plurality of interlayer insulating layers 117 and sacrificial layers 118, which are alternately stacked. For example, the interlayer insulating layer 117 may be formed of an oxide layer such as silicon oxide, and the sacrificial layer 118 may be formed of a nitride layer such as silicon nitride. The materials of the interlayer insulating layer 117 and the sacrificial layer 118 are not limited to the above materials.

The mold structure MS may extend from the step key 110 into the key outer area 115 in the first direction (x-direction) and may have a stepped structure in the key outer area 115. Because the top surface Fck of the alignment vertical channel layer 111 of the step key 110 and the bottom surface Frb of the recessed portion 113 are lower than the top surface Fok of the key outer area 115, in the mold structure MS, the interlayer insulating layer 117 and the sacrificial layer 118 above the key outer area 115 may be higher than the interlayer insulating layer 117 and the sacrificial layer 118 above the step key 110.

An uppermost sacrificial layer (see 118s of FIG. 7D) of the mold structure MS may be formed thicker than the sacrificial layer 118 of another layer. According to an embodiment, the uppermost sacrificial layer may be formed to a substantially the same thickness as the sacrificial layer 118 of another layer. The uppermost sacrificial layer may function as an etch stop layer in the CMP process. Thus, the uppermost sacrificial layer may be referred to as an etch stop layer. Because FIG. 2B corresponds to a state in which the uppermost sacrificial layer is removed after a planarization process, the uppermost sacrificial layer is not shown. Also, although not shown in FIG. 2B, an insulating layer corresponding to an insulating layer on the flat insulating layer 119 in the main chip area MCA may be arranged on the flat insulating layer 119 in the outer chip area OCA.

For reference, alignment of the vertical channel layers 121-1 and 121-2 using the step key 110 may be performed by measuring a top surface of the mold structure MS formed on the step key 110 by using optical measurement equipment and by detecting an intensity and/or a phase difference of reflected light caused by a curve on a top surface of the mold structure MS so as to check the position of the lower alignment vertical channel layer 111. However, in the CMP process of planarizing the mold structure MS, when the uppermost sacrificial layer corresponding to the etch stop layer is ground and removed, the curve on the top surface of the mold structure MS may not be accurately maintained, and an error may occur in measurement using the optical measurement equipment. Accordingly, an error, such as a mis-alignment error, may occur in alignment of the vertical channel layers 121-1 and 121-2. However, in the memory device 100 according to the present embodiment, the alignment vertical channel layer 111 of the step key 110 may be lower than the key outer area 115 so that, in a subsequent planarization process of the mold structure MS, the uppermost sacrificial layer corresponding to the step key 110 may be substantially maintained/preserved, and the curve on the top surface of the mold structure MS may be maintained. Thus, mis-alignment of the vertical channel layers 121-1 and 121-2 may be prevented so that reliability of the memory device 100 may be greatly enhanced.

Figure 3A:
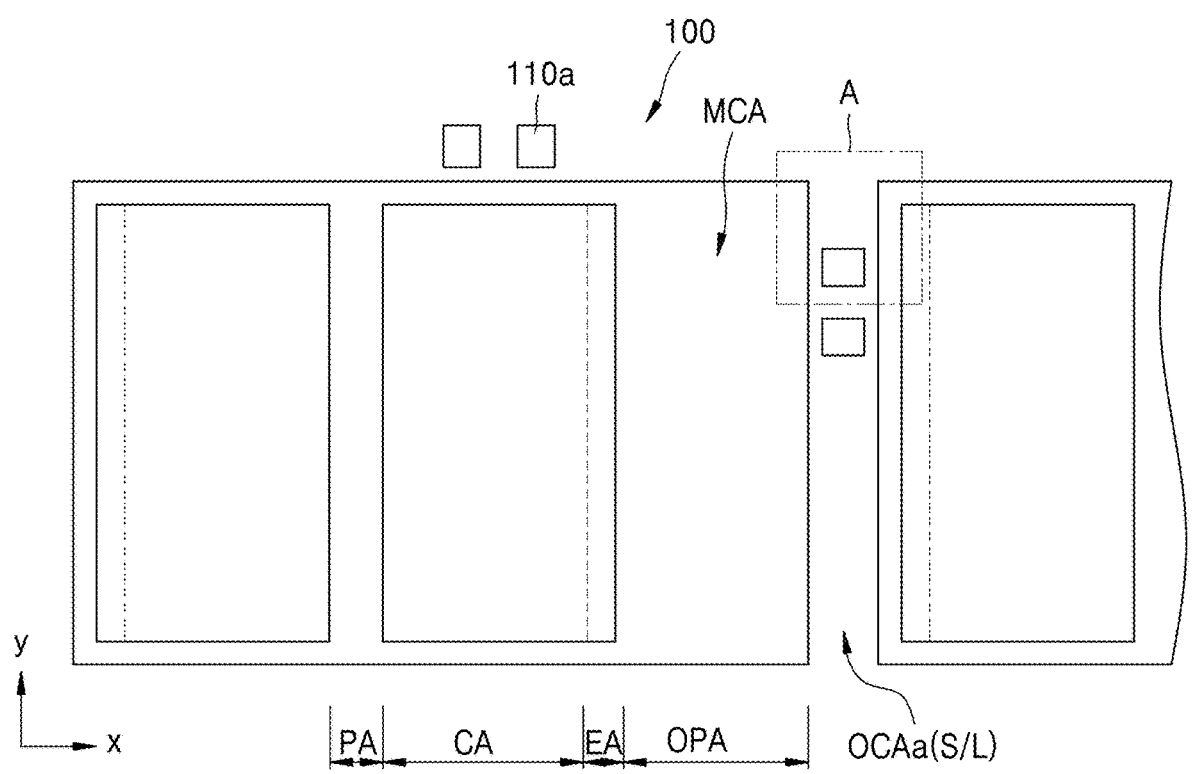
FIGS. 3A through 3C are plan views of the vertical type nonvolatile memory device of FIG. 2A before sawing/dicing, respectively.
Figure 3B:
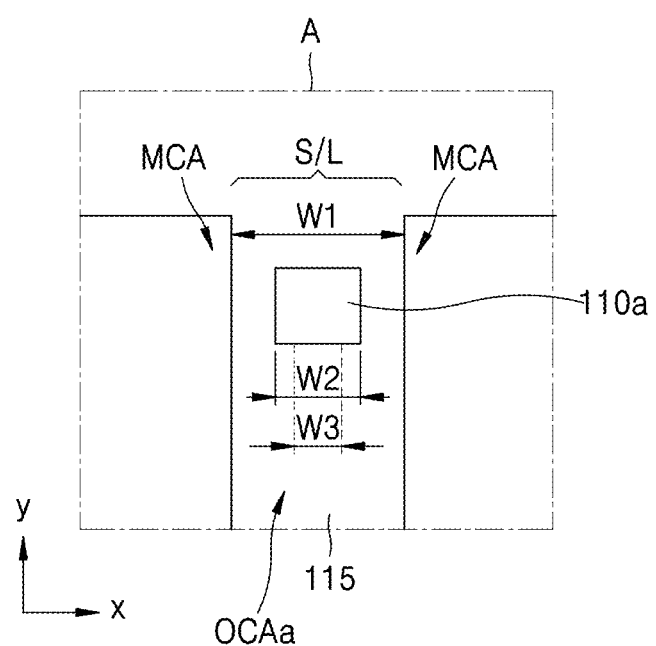
Figure 3C:
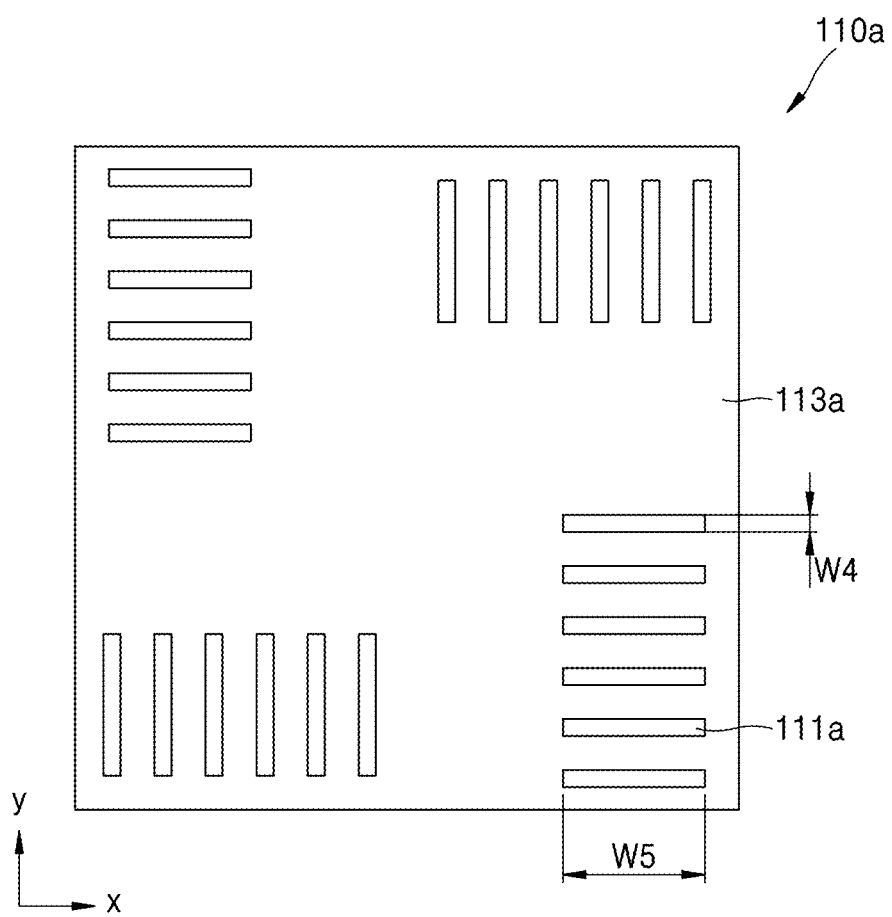

FIGS. 3A through 3C are plan views of the memory device of FIG. 2A before sawing, respectively. FIG. 3B is an enlarged view of portion A of FIG. 3A, and FIG. 3C is an enlarged view of a step key of FIG. 3A. Contents already described in the description of FIGS. 1 through 2C will be briefly descried or omitted. Referring to FIGS. 3A through 3C, the memory device 100 according to the present embodiment may correspond to one semiconductor chip separated from a wafer state through sawing. FIG. 3A shows the memory device 100 before sawing, and an outer chip area OCAa in an intact form may be present outside the main chip area MCA. The outer chip area OCAa may be between the main chip areas MCA. In other words, the outer chip area OCAa may correspond to the scribe lane S/L of the wafer. Thus, the main chip areas MCA may be arranged adjacent in the first direction (x-direction) and the second direction (y-direction) with the outer chip area OCAa therebetween. A width of the outer chip area OCAa in the first direction (x-direction) may be a first width W1, and the first width W1 may be, for example, about 70 μm. The first width W1 of the outer chip area OCAa is not limited to 70 μm.

A step key 110a may be arranged in the outer chip area OCAa. When only a portion between two adjacent main chip areas MCA is restricted to be referred to as one outer chip area OCAa, two step keys 110a may be arranged in one outer chip area OCAa. The number of step keys 110a arranged in one outer chip area OCAa is not limited to two.

The step key 110a may have a square or rectangular shape, as shown in FIG. 3B. When the step key 110a has a square shape, a width of the step key 110a in the first direction (x-direction) may be a second width W2, and the second width W2 may be about 35 µm. The second width W2 of the step key 110a is not limited to 35 µm. In a sawing process of separating semiconductor chips from the wafer, a sawing width may have a third width W3, and the third width W3 may, for example, about 20 µm. The second width W2 of the step key 110a and the third width W3 of the sawing width are not limited to the above values. For reference, when sawing is performed through a right center portion of the outer chip area OCAa and the first width W1, the second width W2 and the third width W3 have the above-described values, in the memory device 100 after sawing, the outer chip area (see OCA of FIG. 2A) may have a width of about 25 µm, and the step key (see 110 of FIG. 2A) may have a width of about 7 to 8 µm.

As shown in FIG. 3C, the step key 110a may include an alignment vertical channel layer 111a and a recessed portion 113a. The alignment vertical channel layer 111a may have a rectangular shape that is elongated in one direction. Specifically, a short side of the alignment vertical channel layer 111a may have a fourth width W4, the fourth width W4 may be, for example, about 1 µm, a long side of the alignment vertical channel layer 111a may have a fifth width W5, and the fifth width W5 may be, for example, about 4 µm. The fourth width W4 and the fifth width W5 are not limited to the above values. As described above, the vertical channel layers 121-1 and 121-2 may have diameters of several hundred nm, for example, diameters of 100 to 200 nm. Thus, the diameters of the vertical channel layers 121-1 and 121-2 may be several times smaller than the fourth width W4 of the short side of the alignment vertical channel layer 111a. Furthermore, in the memory device 100 after sawing, the step key 110 remains in the outer chip area OCAa with the width of about 7 to 8 µm, and at least one alignment vertical channel layer 111 may be completely include in the step key 110. For example, in FIG. 3C, when sawing is performed in the second direction (y-direction), at least one of the left, lower alignment vertical channel layers 111a and the right, upper alignment vertical channel layer 111a may be completely maintained after sawing.

Figure 4A:
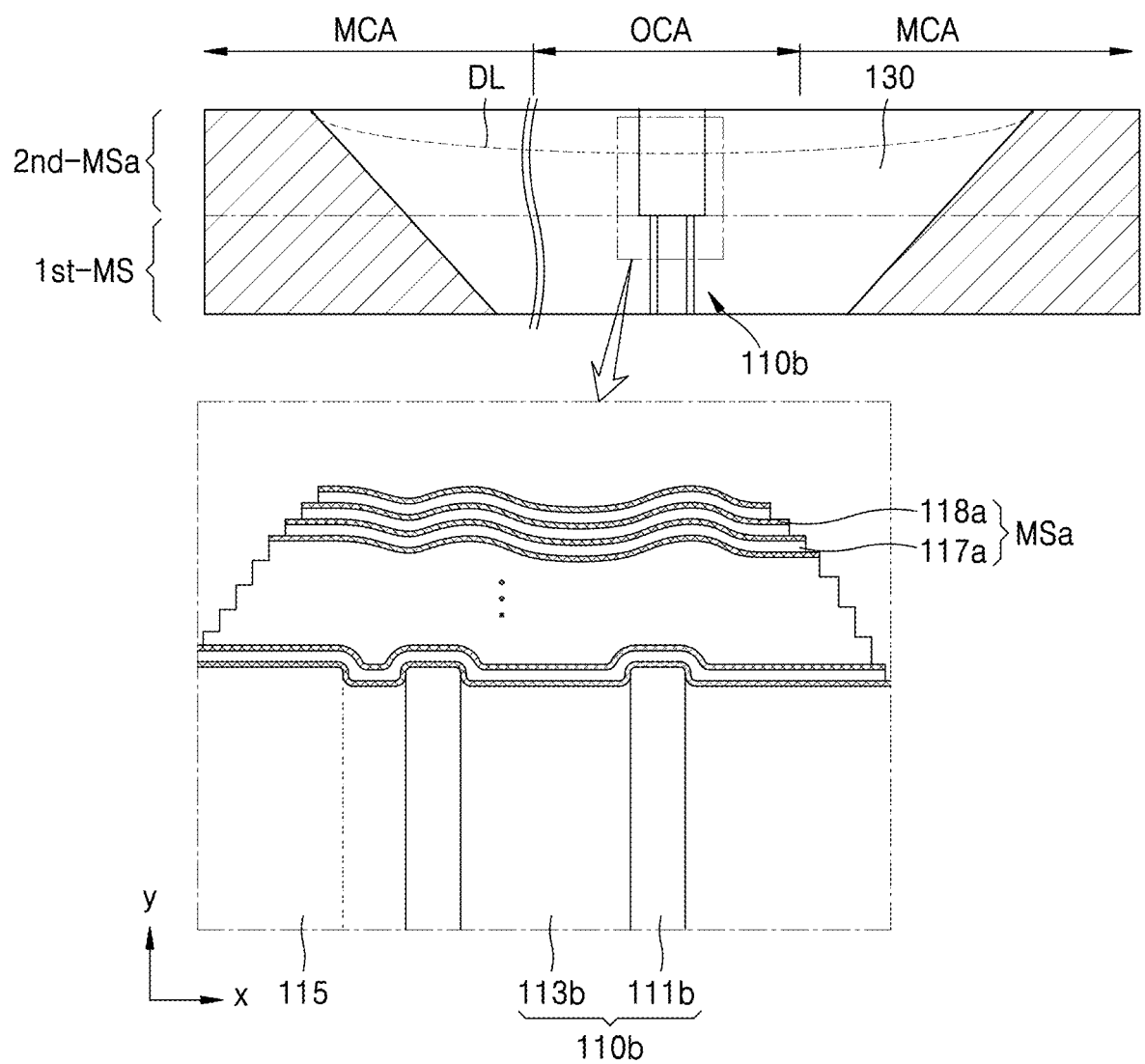
FIGS. 4A and 4B are conceptual views for describing advantages of the vertical type nonvolatile memory device of FIG. 2A.
Figure 4B:
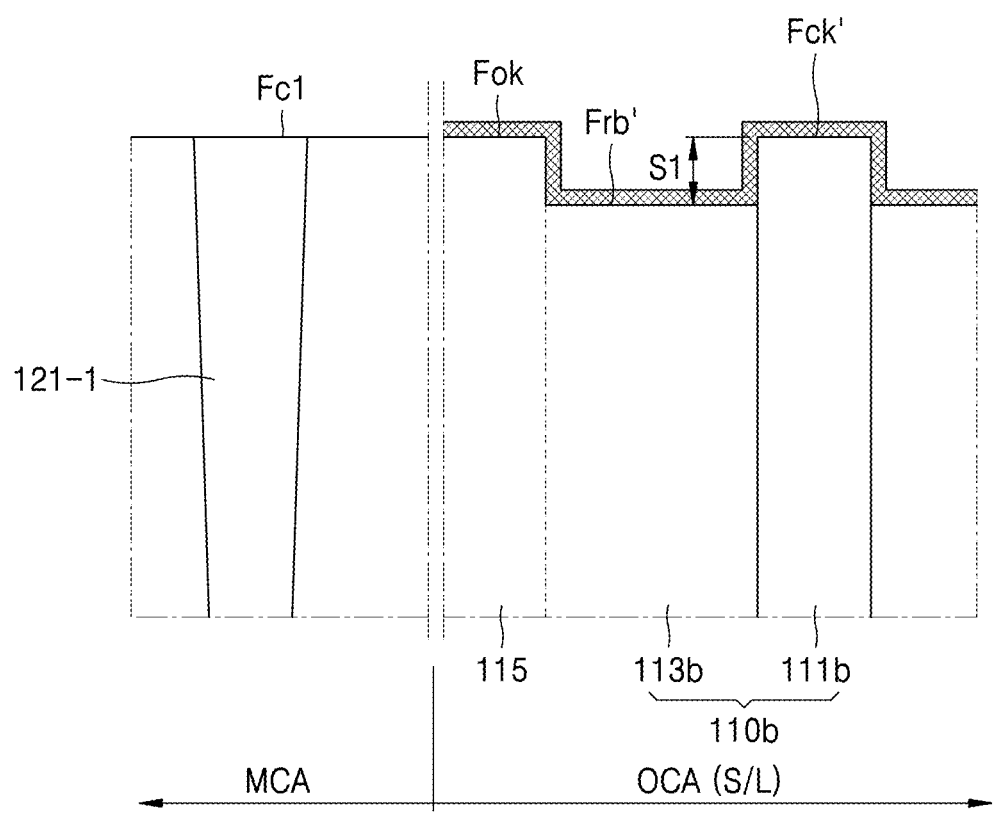

FIGS. 4A and 4B are conceptual views for describing advantages of the memory device of FIG. 2A, FIG. 4A shows a step key of the outer chip area OCA before a planarization process, and FIG. 4B is an enlarged view of portions of a vertical channel layer and a step key of FIG. 4A. FIGS. 4A and 4B will be described with reference to FIGS. 2A through 2C, and contents already described in the description of FIGS. 2A through 2C will be briefly described or omitted.

Referring to FIGS. 4A and 4B, in FIG. 4A, the main chip area MCA may be arranged at both sides of the outer chip area OCA in the first direction (x-direction), and a first mold structure 1st-MS and a second mold structure 2nd-MSa in a cell area CA and an extension area EA of the main chip area MCA are schematically shown. The first mold structure 1st-MS is similar to the first layer 1st-FL of FIG. 2B but may include a first sacrificial layer (see 127-1 of FIG. 7A) instead of the first gate electrode layer 125-1. Also, the second mold structure 2nd-MSa may be in a state of a mold structure in which channel holes are not formed, similarly in the mold structure MSa above a step key 110b, and may include a second sacrificial layer (see 127-2 of FIG. 7B) instead of the second gate electrode layer 125-2.

As can be seen from FIG. 4B, the step key 110b may include an alignment vertical channel layer 111b and a recessed portion 113b, wherein a top surface F'ck of the alignment vertical channel layer 111b may have a substantially the same height as the top surface Fc1 of the first vertical channel layer 121-1. In other words, the alignment vertical channel layer 111b in the step key 110b may be formed to have a substantially the same as the key outer area 115. In the step key 110b, a first step S1 may be maintained between the alignment vertical channel layers 111b and the recessed portion 113b. The first step S1 may be substantially the same as the first step S1 in FIG. 2C.

In general, in a planarization process using CMP, a dishing phenomenon that a portion of an insulating structure 130 that is a single material layer is more etched than a portion of a mold structure having a structure in which a plurality of interlayer insulating layers 117 and sacrificial layers 118 are alternately stacked, may occur. The dishing phenomenon may occur more seriously as the distance from the mold structure MS increases. In FIG. 4A, a portion etched by the dishing phenomenon is indicated by a dotted dishing line DL, which is slightly exaggerated for convenience of understanding.

When the alignment vertical channel layer 111b of the step key 110b has a substantially the same height as the key outer area 115, in a planarization process using CMP, the uppermost sacrificial layer of the mold structure MSa corresponding to the step key 110b may not function as an etch stop layer and may be ground and removed by the dishing phenomenon. As such, a top surface portion of the mold structure MSa corresponding to the step key 110b may not represent the shape of the step key 110b and thus may cause a measurement error and mis-alignment of a vertical channel layer in the optical measurement equipment.

On the other hand, in the memory device 100 according to the present embodiment, before the mold structure MS is formed on the step key 110, the alignment vertical channel layer 111 of the step key 110 may be formed lower than the key outer area 115 so that the uppermost sacrificial layer of the mold structure MS corresponding to the step key 110 may be maintained in spite of the dishing phenomenon in the planarization process using CMP. As such, a curve that may represent the shape of the step key 110 may be maintained on a top surface portion of the mold structure MS corresponding to the step key 110. Thus, the position of the step key 110 may be accurately measured by the optical measurement equipment so that mis-alignment of a vertical channel layer may be effectively prevented and the memory device having reliability may be implemented.

Figure 5A:
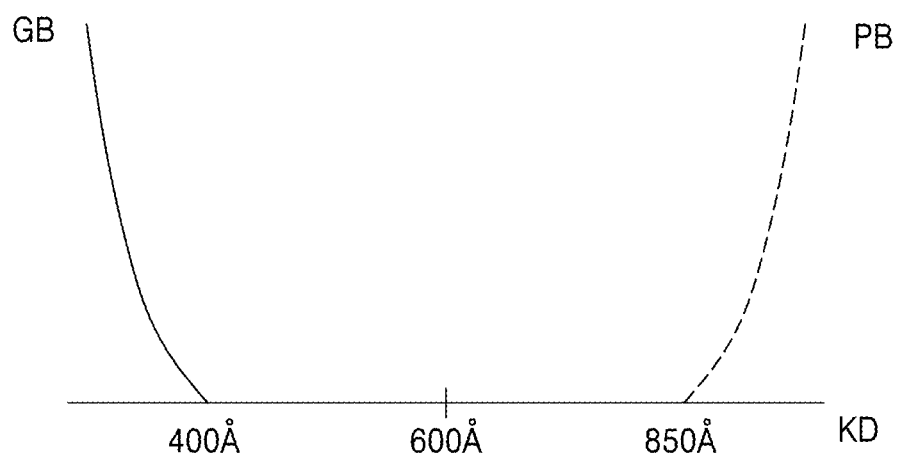
FIGS. 5A and 5B are a graph and photos for describing the effects of a step key depth in the vertical type nonvolatile memory device of FIG. 2A.
Figure 5B:
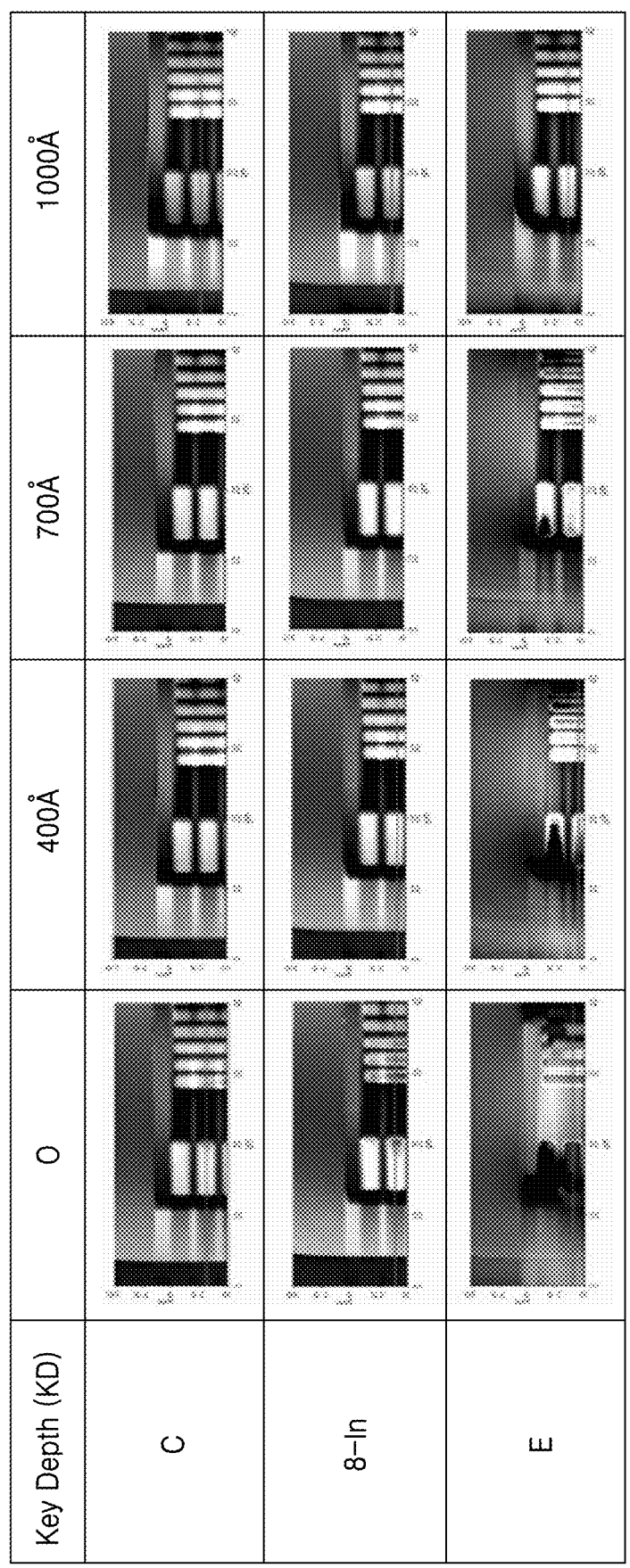

FIGS. 5A and 5B are a graph and photos for describing the effects of a step key depth in the memory device of FIG. 2A. FIG. 5A shows grinding bad GB and patterning bad PB according to a step key depth KD, and FIG. 5B are photos showing a grinding state of a step key according to the step key depth KD in a center part C of a wafer, a portion 8—In corresponding to a diameter of 8 inches in the wafer and an edge part E of the wafer. FIGS. 5A and 5B will be described with reference to FIGS. 2A through 2C together, and contents already described in the description of FIGS. 2A through 2C will be briefly described or omitted.

Referring to FIG. 5A, it can be seen from the graph that, when the step key depth KD has a range of, for example, about ±150 Å based on 600 Å, grinding of the step key 110 may be satisfactorily enhanced. Here, the step key depth KD may correspond to a first depth D1 of FIG. 2C described above.

In more detail, as can be seen through a left solid line, when the step key depth KD decreases to be equal to or less than 400 Å, the grinding state of the step key 110 may be deteriorated. Here, the grinding state may represent less or more grinding of the step key, and the greater the grinding, the worse the grinding state may be. Grinding of the step key may refer to grinding of the top surface of the mold structure MS above the step key 110, not directly grinding of the step key 110 in FIG. 2B.

As can be seen through the right dotted line, when the step key depth KD increases to be equal to or greater than 850 Å, a patterning state may be deteriorated. Here, the patterning state that is a state for patterning of channel holes may mean that, when the step key depth KD increases to be equal to or greater than 850 Å, patterning of the channel holes becomes difficult.

Referring to FIG. 5B, when the step key depth KD is 0, the grinding state of the step key 110 may be bad in all positions of the wafer. Also, when the step key depth KD is 400 Å and 700 Å, in the center part C of the wafer and the part 8—In corresponding to a diameter of 8 inches in the wafer, the griding state of the step key 110 is slightly good but in the edge part E of the wafer, the grinding state of the step key 110 may be still bad. When the step key depth KD is 1000 Å, the griding state of the step key 110 in all positions of the wafer may be good. However, as mentioned in the description of FIG. 5A, when the step key depth KD increases, patterning of channel holes may become difficult. For reference, the photos of FIG. 5B are photos measured by the optical measurement equipment and do not show that the step key 110 is actually ground but show a shape in which the step key 110 is detected according to the grinding state of a portion of the top surface of the mold structure MS above the step key 110.

As such, the step key depth KD may be properly selected considering the grinding state and the patterning state of the channel holes. For example, based on the graph of FIG. 5A, the step key depth KD may be selected within ±150 Å based on 600 Å.

Figure 6A:
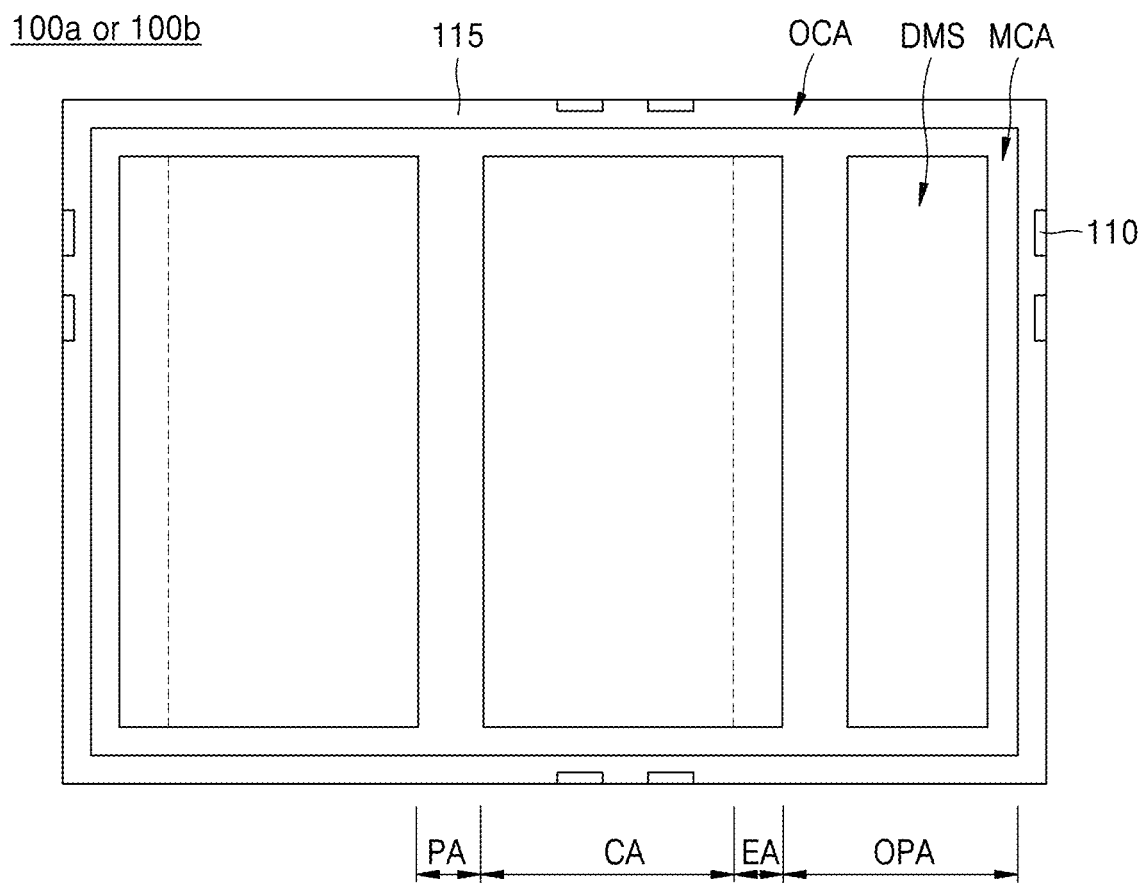
Figure 6B:
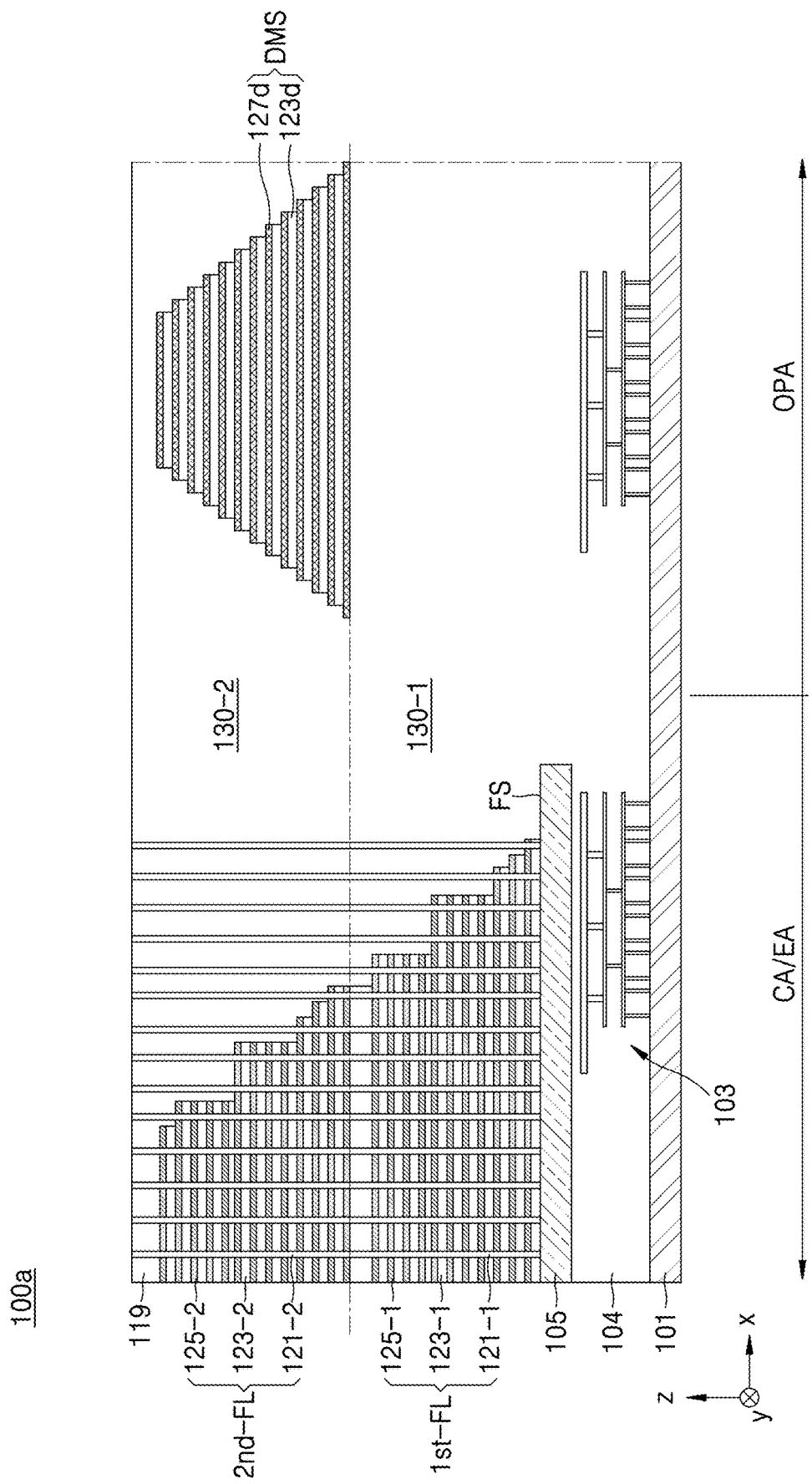

FIGS. 6A through 6C are a plan view and cross-sectional views of a memory device according to example embodiments, and FIGS. 6B and 6C show only a main chip area. Contents already described in the description of FIGS. 2A through 5B will be briefly described or omitted.

Referring to FIGS. 6A and 6B, a memory device 100a according to the present embodiment may be different from the memory device 100 of FIG. 2A in that a dummy mold structure DMS is further included in the outer peri area OPA of the main chip area MCA. In detail, in the memory device 100a according to the present embodiment, the dummy mold structure DMS may be formed in the outer peri area OPA corresponding to the second layer 2nd-FL. The dummy mold structure DMS may include a plurality of dummy interlayer insulating layers 123d and dummy sacrificial layers 127d, which are alternately stacked. Also, the dummy mold structure DMS may include a stepped structure at both edge portions.

When the dummy mold structure DMS is arranged in the outer peri area OPA, a portion of an insulating structure 130 of a single material layer arranged between the cell area CA and/or the extension area EA and the outer chip area OCA may be relatively narrow, and the mold structure MS above the step key 110 in the outer chip area OCA may be adjacent to the dummy mold structure DMS so that a dishing phenomenon in the planarization process using CMP may be reduced. Also, in the memory device 100a according to the present embodiment, the alignment vertical channel layer 111 of the step key 110 may be formed lower than the key outer area 115. Thus, in the memory device 100a according to the present embodiment, the grinding of the uppermost sacrificial layer and the curve of the top surface of the mold structure MS corresponding to the step key 110 may be further prevented.

Referring to FIGS. 6A and 6C, the memory device 100b according to the present embodiment may be different from the memory device 100a of FIG. 6B in that two-layers of dummy mold structures DMS-1 and DMS-2 are included in the outer peri area OPA of the main chip area MCA. Specifically, in the memory device 100b according to the present embodiment, the first dummy mold structure DMS-1 and the second dummy mold structure DMS-2 may be formed in the outer peri area OPA corresponding to the first layer 1st-FL and the second layer 2nd-FL. Each of the first dummy mold structure DMS-1 and the second dummy mold structure DMS-2 may include a plurality of dummy interlayer insulating layers 123d-1 and 123d-2 and dummy sacrificial layers 127d-1 and 127d-2, which are alternately stacked. Also, each of the first dummy mold structure DMS-1 and the second dummy mold structure DMS-2 may include a stepped structure at both edge portions.

Even in the memory device 100b according to the present embodiment, a dishing phenomenon in the planarization process using CMP may be reduced by the dummy mold structures DMS-1 and DMS-2. Also, in the memory device 100b according to the present embodiment, the alignment vertical channel layer 111 of the step key 110 may be formed lower than the key outer area 115. Thus, in the memory device 100b according to the present embodiment, the griding of the uppermost sacrificial layer and the curvature of the top surface of the mold structure MS corresponding to the step key 110 may be further prevented.

Embodiments are not limited to the shapes of the dummy mold structures DMS, DMS-1, and DMS-2 of the memory devices 100a and 100b of FIGS. 6B and 6C, and dummy mold structures in various shapes may be arranged in the outer peri area OPA. For example, two spaced lower dummy mold structures may be arranged in the outer peri area OPA corresponding to the first layer 1st-FL, and one upper dummy mold structure may be arranged in the outer peri area OPA corresponding to the second layer 2nd-FL and may be arranged at a corresponding position between two lower dummy mold structures. Also, on the contrary, one lower dummy mold structure may be arranged in the outer peri area OPA corresponding to the first layer 1st-FL, and two upper dummy mold structures may be arranged in the outer peri area OPA corresponding to the second layer 2 nd-FL, and the lower dummy mold structure may be arranged at a corresponding position between two upper dummy mold structures. In addition, dummy mold structures may be arranged in various shapes. Furthermore, as described above, through-vias may be arranged in the outer peri area OPA. However, for convenience, in FIGS. 6B and 6C, through-vias may be omitted and may not be shown.

FIGS. 7A through 7E are cross-sectional views showing a method of manufacturing the memory device of FIG. 2A. FIGS. 7A through 7E will be described with reference to FIGS. 2A through 2C together, and contents already described in the description of FIGS. 2A through 6C will be briefly described or omitted.

Referring to FIG. 7A, the method of manufacturing the memory device 100 according to the present embodiment may include forming a peripheral circuit 103 and a lower interlayer insulating layer 104 on a lower substrate 101 and planarizing the lower interlayer insulating layer 104. Subsequently, a trench for a substrate may be formed in an upper portion of the lower interlayer insulating layer 104, and an upper substrate 105 may be formed by filling the trench portion with polysilicon. Subsequently, after a first interlayer insulating layer 123-1 and a first sacrificial layer 127-1 may be alternately stacked on the upper substrate 105 and a stepped structure is formed in the extension area EA, an insulating layer for covering the entire resultant structure on the upper substrate 105 may be formed and planarized, thereby forming a first insulating structure 130-1. Also, channel holes may be formed in the main chip area MCA, and a first vertical channel layer 121-1 may be formed by filling the channel holes with a semiconductor layer, a data storage layer, and a buried insulating layer, thereby completing a first mold structure 1st-MS. The first mold structure 1st-MS may be different from the first layer 1st-FL in the memory device of FIG. 2B in that the first mold structure 1st-ML includes the first sacrificial layer 127-1 instead of the first gate electrode layer 125-1.

When the first vertical channel layer 121-1 is formed, a pre-alignment vertical channel layer 111b may be formed in the outer chip area OCA. The pre-alignment vertical channel layer 111b may be different from the first vertical channel layer 121-1 in shape and size. However, top surfaces of the pre-alignment vertical channel layer 111b and the first vertical channel layer 121-1 may have substantially the same heights.

Figure 7B:
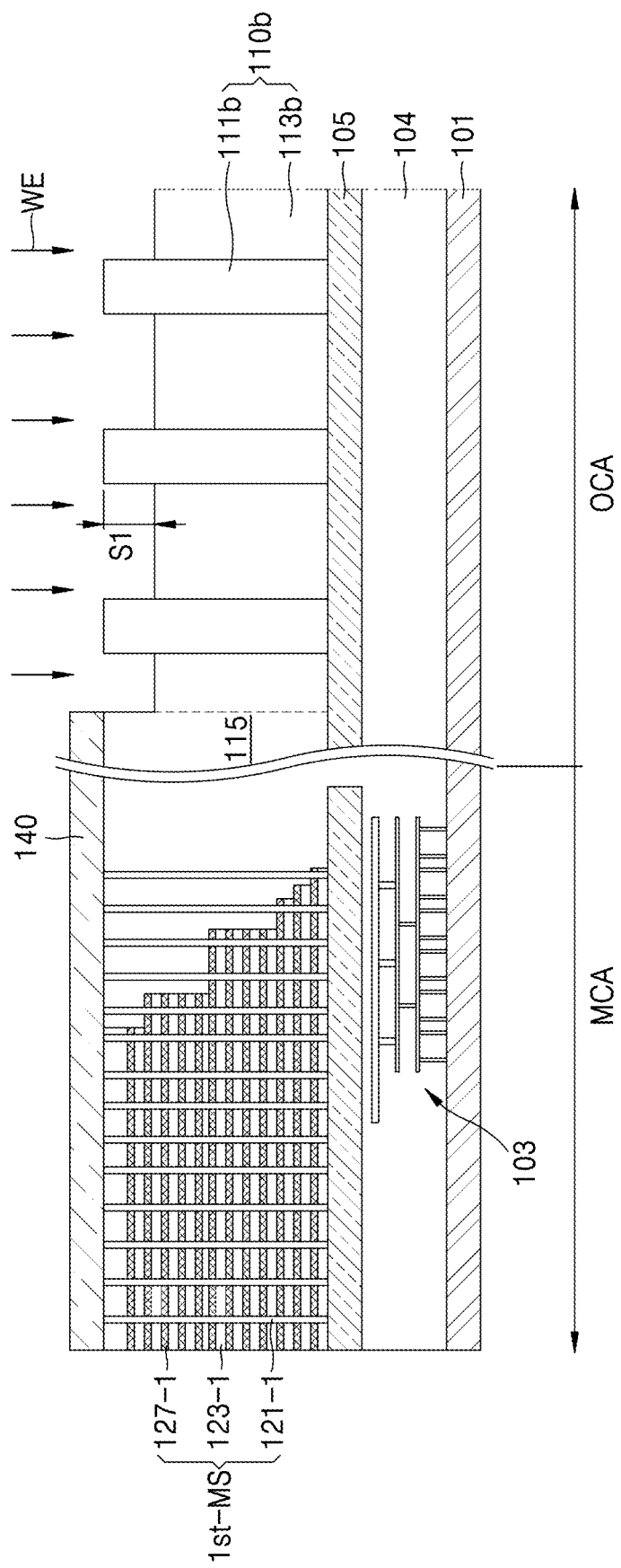

Referring to FIG. 7B, a PR pattern 140 may be formed on the first mold structure 1st-MS and the first insulating structure 130-1. The PR pattern 140 may cover the entire main chip area MCA and may also cover an area excluding an area in which the step key 110 is to be formed, from the outer chip area OCA, i.e., the key outer area 115. Subsequently, the upper portion of the first insulating structure 130-1 may be wet-etched WE by using the PR pattern 140 as a mask, thereby forming a pre-step key 110b including a pre-recessed portion 113b and a pre-alignment vertical channel layer 111b. When the upper portion of the first insulating structure 130-1 is wet-etched WE, only the first insulating structure 130-1 may be etched by using an etchant having high etching selectivity, i.e., an etchant having high etching speed with respect to the first insulating structure 130-1.

As shown in FIG. 7B, in the pre-step key 110b, a bottom surface of the pre-recessed portion 113b and a top surface of the pre-alignment vertical channel layer 111b may have a first step S1. The pre-step key 110b may have a substantially the same structure as the step key 110b of FIG. 4B.

Figure 7C:
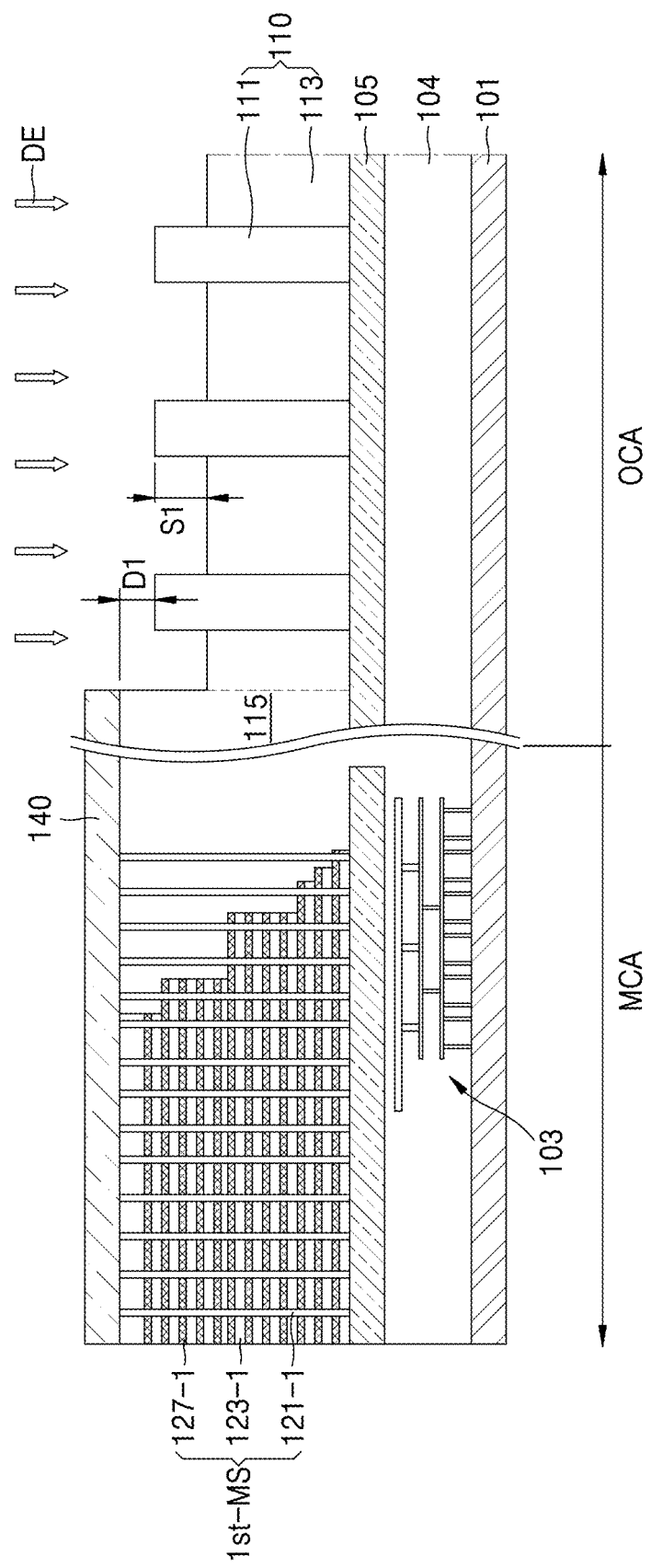

Referring to FIG. 7C, subsequently, the pre-step key 110b may be dry-etched DE by using the PR pattern 140 as a mask, thereby forming a step key 110 including the alignment vertical channel layer 111 and the recessed portion 113. The pre-step key 110b may be lowered through dry etching DE by a first depth D1 so that the step key 110 may be formed. That is, the pre-recessed portion 113b may be lowered by the first depth D1 and may be the recessed portion 113, and the pre-alignment vertical channel layer 111b may be lowered by the first depth D1 and may be the alignment vertical channel layer 111. Thus, in the step key 110, a bottom surface of the recessed portion 113 and a top surface of the alignment vertical channel layer 111 may have a first step S1. The step key 110 may have substantially the same structure as the step key 110 of FIG. 2B.

Figure 7D:
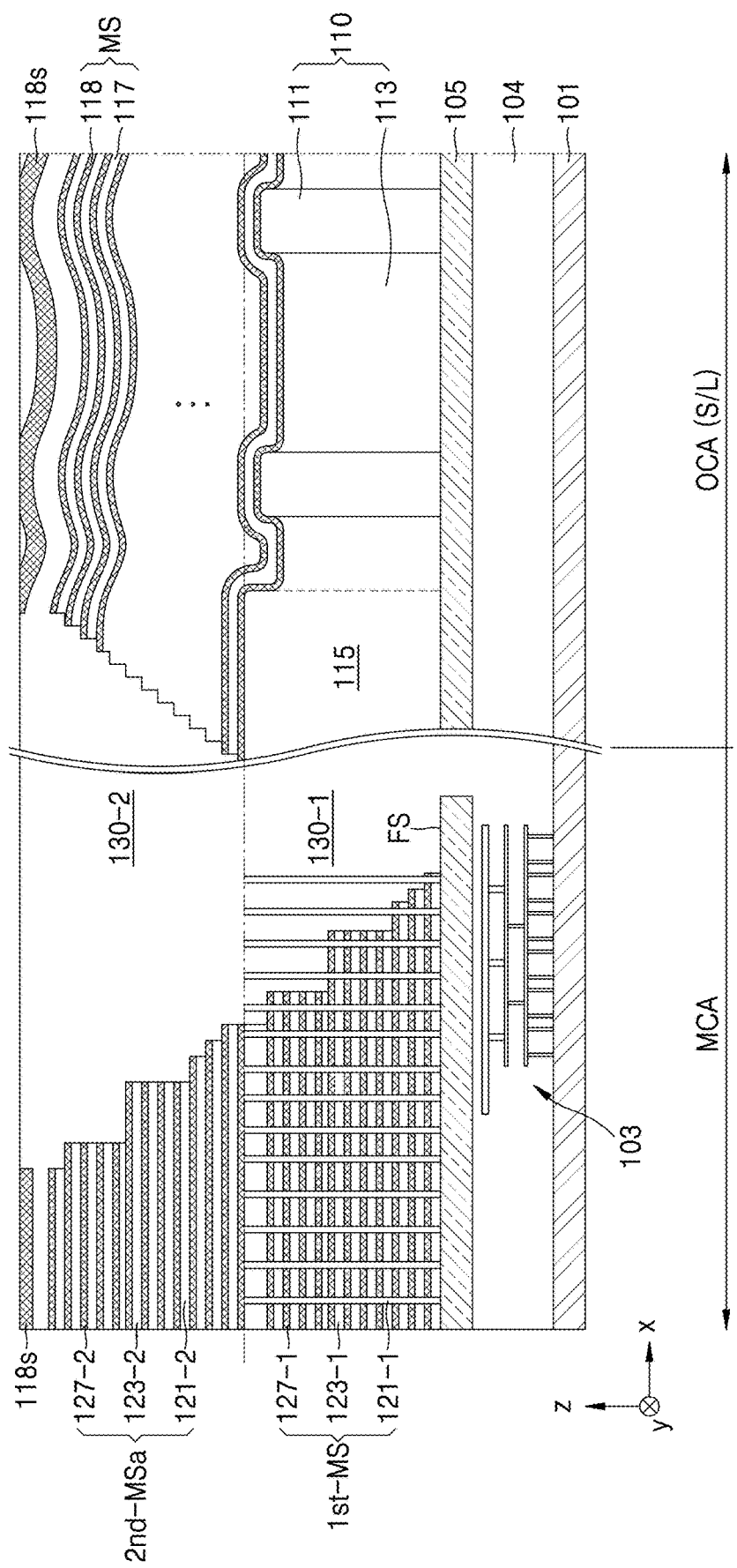

Referring to FIG. 7D, subsequently, after the PR pattern 140 is removed through an ashing and stripping process and an insulating layer material and a sacrificial layer material are alternately stacked on the entire resultant structure on the upper substrate 105 and a stepped structure is formed at edge portions of the extension area EA and the outer chip area OCA, an insulating layer for covering the entire resultant structure on the upper structure 105 may be formed and planarized through CMP. Through a planarization process, an initial second mold structure 2nd-MSa may be formed in the main chip area.

In the planarization process, a portion of the uppermost sacrificial layer 118s in the outer chip area OCA may be etched. That is, all or a portion of the uppermost sacrificial layer 118a of a portion corresponding to the key outer area 115 may be etched. Also, as shown in FIG. 7D, at least a portion of an uppermost sacrificial layer 118s corresponding to the alignment vertical channel layer 111 of the step key 110 may be maintained, and the uppermost sacrificial layer 118s corresponding to the recessed portion 113 may be maintained fully. Also, according to an embodiment, the uppermost sacrificial layer 118s corresponding to the alignment vertical channel layer 111 of the step key 110 may also be maintained fully. This may be caused by the alignment vertical channel layer 111 of the step key 110 formed lower than the key outer area 115 by the first depth D1.

Figure 7E:
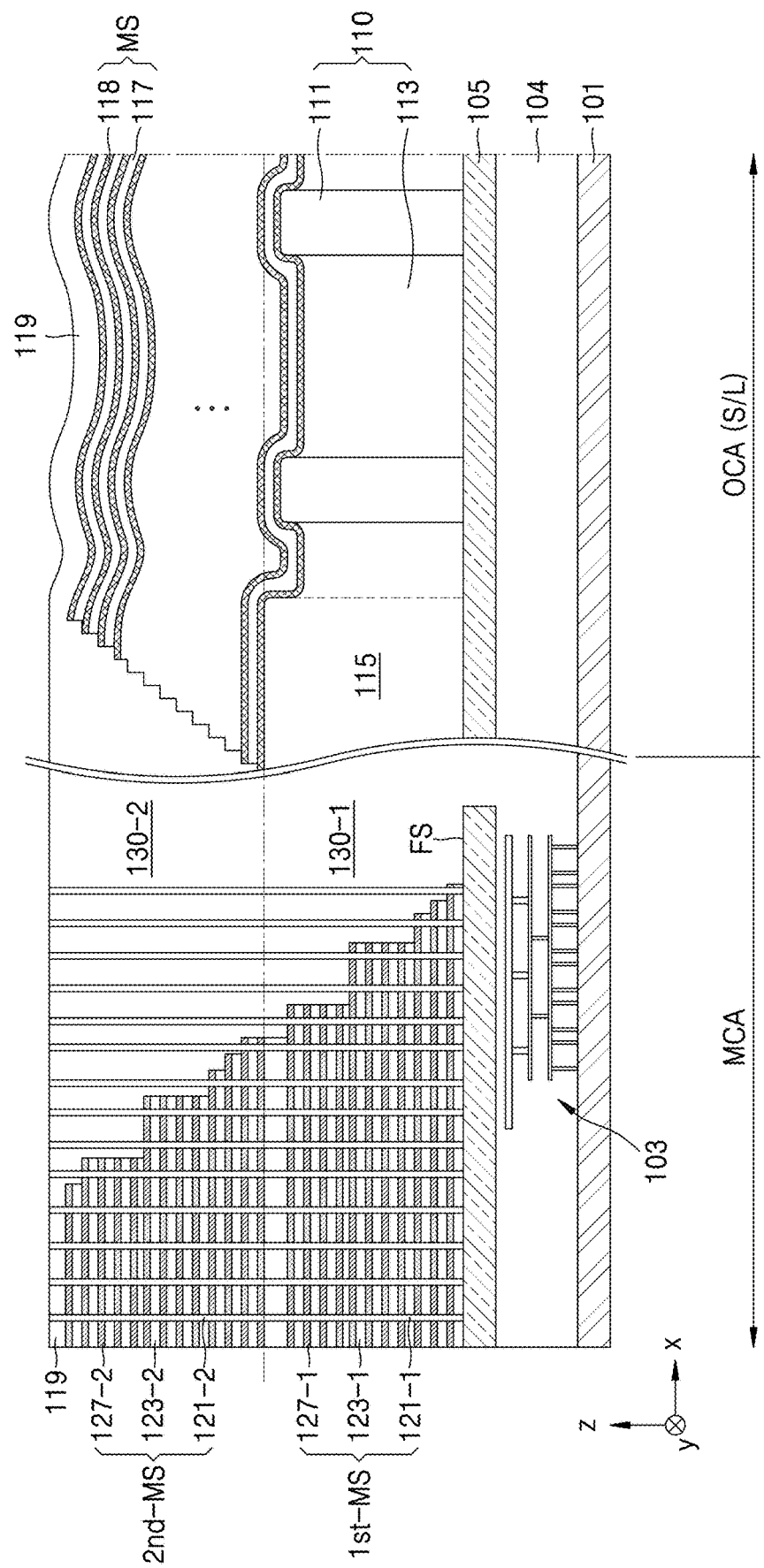

Referring to FIG. 7E, after the uppermost sacrificial layer 118s on the main chip area MCA is removed and channel holes are formed, a second vertical channel layer 121-2 may be formed by filling the channel holes with a semiconductor layer, a data storage layer, and a buried insulating layer, thereby completing a second mold structure 2nd-MS. The second mold structure 2nd-MS may be different from the second layer 2nd-FL in the memory device of FIG. 2B in that the second mold structure 2nd-MS includes a second sacrificial layer 127-2 instead of the second gate electrode layer 125-2. Subsequently, an separation area may be formed, and gate electrode layers 125-1 and 125-2 may be formed through a replacement process using the separation area, thereby forming a first layer 1st-FL and a second layer 2n-FL of FIG. 2B.

Figure 8:
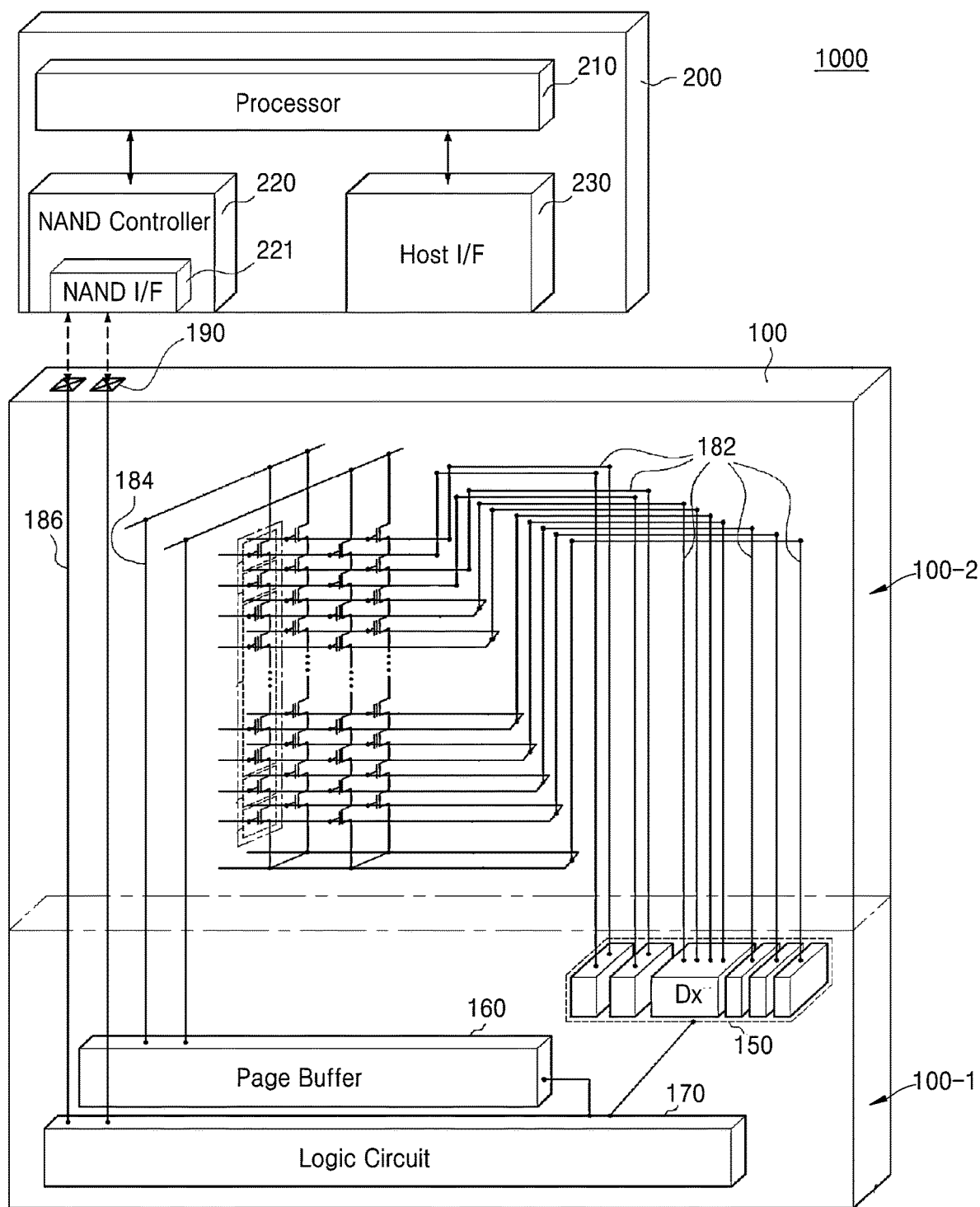
FIG. 8 is a conceptual view schematically showing an electronic system including a vertical type nonvolatile memory device according to an example embodiment.

FIG. 8 is a conceptual view schematically showing an electronic system including a memory device according to an example embodiment. Contents already described in the description of FIGS. 1 through 6C will be briefly described or omitted. Referring to FIG. 8, an electronic system 1000 (hereinafter, simply referred to as an 'electronic system') including the memory device 100 according to the present embodiment may include the memory device 100 and a controller 200 electrically connected to the memory device 100. The electronic system 1000 may be a storage device including one or a plurality of memory devices 100 or an electronic device including the storage device. For example, the electronic system 1000 may be a solid state drive (SSD) device, a universal serial bus (USB), a computing system, a medical device, or a communication device including one or a plurality of memory devices 100. The memory device 100 may be a vertical type nonvolatile memory device, for example, a NAND flash memory device. Also, the memory device 100 may be memory devices 100, 100a, and 100b of FIGS. 2A through 2C and FIGS. 6A through 6C.

The memory device 100 may include a first structure 100-1 and a second structure 100-2 on the first structure 100-1. According to an embodiment, the first structure 100-1 may be arranged next to the second structure 100-2. The first structure 100-1 may include a peripheral circuit such as a decoder circuit 150, a page buffer 160, and a logic circuit. The second structure 100-2 may include a common source line CSL, a plurality of bit lines BL0 to BLm, and a plurality of cell strings CSTR, as shown in FIG. 1. Also, each of the plurality of cell strings CSTR may include string selection transistors SSt1 and SSt2, memory cell transistors MCT, and a ground selection transistor GST. Gate electrodes of the string selection transistors SSt1 and SSt2 may be connected to the string selection lines SSL1 and SSL2, and a gate electrode of the ground selection transistor GST may be connected to the ground selection line GSL. Also, gate electrodes of the memory cell transistors MCT may be connected to word lines WL0 to WLn.

The common source line CSL, the string selection lines SSL1 and SSL2, the word lines WL0 to WLm, and the ground selection line GSL may be electrically connected to the decoder circuit 150 via first connection wirings 182 that extend to the second structure 100-2 within the first structure 100-1. The bit lines BL0 to BLm may be electrically connected to the page buffer 160 via second connection wirings 184 that extend to the second structure 100-2 within the first structure 100-1.

In the first structure 100-1, the decoder circuit 150 and the page buffer 160 may perform a control operation on at least one selection memory cell transistor among the plurality of memory cell transistors MCT. The decoder circuit 150 and the page buffer 160 may be controlled by a logic circuit 170. The memory device 100 may communicate with a controller 200 via an input/output pad 190 electrically connected to the logic circuit 170. The input/output pad 190 may be electrically connected to the logic circuit 170 via an input/output connection wiring 186 that extend to the second structure 100-2 within the first structure 100-1.

The controller 200 may include a processor 210, a NAND controller 220, and a host interface 230. According to an embodiment, an electronic system 1000 may include a plurality of memory devices 100. In this case, the controller 200 may control the plurality of memory devices 100. The processor 210 may control an overall operation of the electronic system 1000. The processor 210 may operate according to a certain firmware and may access the memory device 100 by controlling the NAND controller 220. The NAND controller 220 may include a NAND interface 221 that processes communication with the memory devices 100. Through the NAND interface 22, a control command for controlling the memory device 100, data to be recorded in the memory cell transistors MCT of the memory device 100, and data to be read from the memory cell transistors MCT of the memory device 100 may be transmitted. The host interface 230 may provide a communication function between the electronic system 1000 and an external host. When the control command is received from the external host through the host interface 230, the processor 210 may control the memory device 100 in response to the control command.

Figure 9:
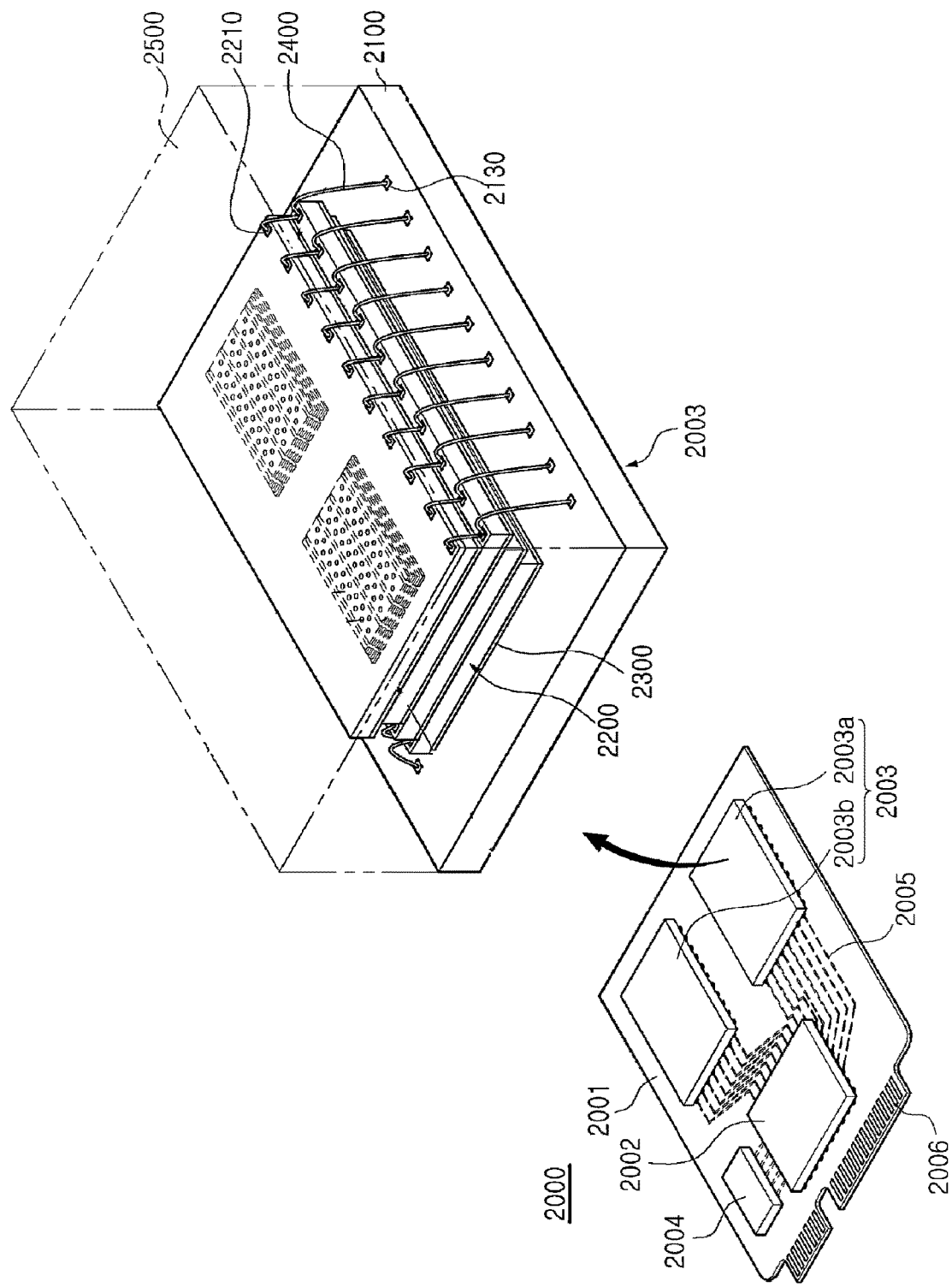
FIG. 9 is a perspective view of an electronic system package including a vertical type nonvolatile memory device according to an example embodiment.

FIG. 9 is a perspective view of an electronic system package including a memory device according to an example embodiment. Contents already described in the description of FIGS. 1 through 6C and FIG. 8 will be briefly described or omitted. Referring to FIG. 9, an electronic system package 2000 (hereinafter, simply referred to as an 'electronic system package') including the memory device 100 according to the present embodiment may include a main board 2001, a semiconductor package 2003, and a DRAM 2004. The semiconductor package 2003 and the DRAM 2004 may be connected to a controller 2002 via wiring patterns 2005 formed on the main board 2001.

The main board 2001 may include a connector 2006 including a plurality of fins combined with the external host. In the connector 2006, the number and arrangement of a plurality of fins may vary according to a communication interface between the electronic system package 2000 and the external host. According to an embodiment, the electronic system package 2000 may communicate with the external host through any one of interfaces such as a USB, Peripheral Component Interconnect Express (PCI-Express), Serial Advanced Technology Attachment (SATA), and M-Phy for Universal Flash Storage (UFS). Also, according to an embodiment, the electronic system package 2000 may operate by power supplied from the external host via the connector 2006. The electronic system package 2000 may further include a power management integrated circuit (PMIC) that distributes power supplied from the eternal host to the controller 2002 and the semiconductor package 2003.

The controller 2002 may record data in the semiconductor package 2003 or may read data from the semiconductor package 2003 and may enhance and control the operating speed of the electronic system package 2000. The DRAM 2004 may be a buffer memory for mitigating a speed difference between the semiconductor package 2003, which is a data storage space, and the external host. The DRAM 2004 included in the electronic system package 2000 may operate as a kind of cache memory and may temporarily store data in a control operation of the semiconductor package 2003. When the electronic system package 2000 includes the DRAM 2004, the controller 2002 may further include a DRAM controller for controlling the DRAM 2004 in addition to a NAND controller for controlling the semiconductor package 2003.

The semiconductor package 2003 may include first and second semiconductor packages 2003a and 2003b, which are spaced apart from each other. The first and second semiconductor packages 2003a and 2003b may include semiconductor packages each including a plurality of semiconductor chips 2200. Each of the first and second semiconductor packages 2003a and 2003b may include a package substrate 2100, semiconductor chips 2200 on the package substrate 2100, adhesive layers 2300 on a bottom surface of each of the semiconductor chips 2200, wirings 2400 for electrically connecting the semiconductor chips 2200 and the package substrate 2100, and a molding layer 2500 for covering the semiconductor chips 2200 and the wirings 2400 on the package substrate 2100.

The package substrate 2100 may be a printed circuit board including the substrate pads 2130. Each semiconductor chip 2200 may include an input/output pad 2210. Each of the semiconductor chips 2200 may be memory devices 100, 100a, and 100b of FIGS. 2A through 2C and FIGS. 6A through 6C.

According to an embodiment, the wirings 2400 may be bonding wires for electrically connecting the input/output pad 2210 to the substrate pads 2130. Also, according to an embodiment, the semiconductor chips 2200 may be electrically connected to the package substrate 2100 via through electrodes instead of the wirings 2400 of the bonding wire. According to an embodiment, the controller 2002 and the semiconductor chips 2200 may be included in one package. According to an embodiment, the controller 2002 and the semiconductor chips 2200 may be mounted on a separate interposer substrate different from the main board 2001, and the controller 2002 and the semiconductor chips 2200 may be connected to each other via wirings of the interposer substrate and may also be connected to the main board.

While the inventive concept has been particularly shown and described with reference to embodiments thereof, it will be understood that various changes in form and details may be made therein without departing from the spirit and scope of the following claims.

What is claimed is:

1. A vertical type nonvolatile memory device comprising:
   a substrate;
   a cell area in which a plurality of cells are arranged on the substrate;

an extension area extending from the cell area in a first direction and arranged to have a stepped structure on the substrate; and an outer area, which is adjacent to the extension area in the first direction and adjacent to the cell area in a second direction perpendicular to the first direction on the substrate and in which a step key used in alignment of a vertical channel layer is arranged, wherein;

each of the cell area and the extension area comprises a first layer on the substrate and a second layer on the first layer, the vertical channel layer comprises a first vertical channel layer arranged in the first layer and a second vertical channel layer arranged in the second layer, the step key comprises an alignment vertical channel layer corresponding to the first vertical channel layer, and a top surface of the alignment vertical channel layer is lower than a top surface of the first vertical channel layer, and the outer area comprises an insulating structure of a single material layer on the substrate, the insulating structure has a thickness corresponding to a height of the first vertical channel layer, and the alignment vertical channel layer has a rectangular pillar shape extending vertically from the substrate through the insulating structure.

2. The vertical type nonvolatile memory device of claim 1, wherein the step key further comprises a recessed portion that is a portion other than the alignment vertical channel layer, and the outer area comprises the step key and a key outer area corresponding to the first layer and a mold structure corresponding to the second layer and covering the step key and the key outer area, the mold structure comprises a plurality of sacrificial layers and interlayer insulating layers, which are alternately stacked, and a top surface of the key outer area has a substantially the same height as a top surface of the first vertical channel layer.

3. The vertical type nonvolatile memory device of claim 2, wherein the top surface of the alignment vertical channel layer is higher than a bottom surface of the recessed portion by a first step, a curve corresponding to the first step is formed on a top surface of the mold structure, and the step key and the curve are used in alignment of the first vertical channel layer and a second vertical channel layer.

4. The vertical type nonvolatile memory device of claim 1, further comprising an outer peri area between the extension area and the outer area in the first direction, wherein the outer peri area is formed of at least one of an insulating structure and a mold structure.

5. The vertical type nonvolatile memory device of claim 1, wherein the outer area is a portion of a scribe lane of a wafer that remains after sawing, the step key has a shape in which a first step key having a rectangular shape formed in the scribe lane remains by sawing, and a plurality of alignment vertical channel layers are arranged within the rectangle with a certain arrangement rule.

6. The vertical type nonvolatile memory device of claim 1, wherein the step key further comprises an electrically insulating recessed portion, which abuts the alignment vertical channel layer, and wherein the alignment vertical channel layer protrudes from the electrically insulating recessed portion such that the top surface of the alignment vertical channel layer is spaced farther from an underlying surface of the substrate relative to a top surface of the electrically insulating recessed portion.

7. The nonvolatile memory device of claim 1, wherein the alignment vertical channel layer and the first vertical channel layer comprise the same material.

8. The vertical type nonvolatile memory device of claim 1, wherein the outer chip area extends in the first direction or in a second direction perpendicular to the first direction, and two step keys are arranged in the outer chip area in a direction in which the outer chip area extends.

9. A vertical type nonvolatile memory device comprising:

a main chip area comprising a cell area and an extension area extending from the cell area in a first direction and arranged to have a stepped structure, wherein the cell area and the extension area are formed in a multi-stack structure, which extends on a substrate; and an outer chip area, which surrounds the main chip area and in which a first portion of a step key used in alignment of a vertical channel layer remains, wherein:

the main chip area comprises a first layer arranged on a substrate and a second layer on the first layer, the vertical channel layer comprises a first vertical channel layer arranged in the first layer and a second vertical channel layer arranged in the second layer, the first portion comprises an alignment vertical channel layer corresponding to the first vertical channel layer, and a top surface of the alignment vertical channel layer is lower than a top surface of the first vertical channel layer, and the outer chip area comprises an insulating structure of a single material layer on the substrate, the insulating structure has a thickness corresponding to a height of the first vertical channel layer, and the alignment vertical channel layer has a rectangular pillar shape extending vertically from the substrate through the insulating structure.

10. The vertical type nonvolatile memory device of claim 9, wherein the outer chip area comprises the first portion and a key outer area corresponding to the first layer and a mold structure corresponding to the second layer and covering the first portion and the key outer area, the first portion further comprises a recessed portion that is a portion other than the alignment vertical channel layer, a top surface of the key outer area has a substantially the same height as a top surface of the first vertical channel layer, a top surface of the alignment vertical channel layer is higher than a bottom surface of the recessed portion by a first step, and a curve corresponding to the first step is formed on a top surface of the mold structure.

11. The vertical type nonvolatile memory device of claim 9, further comprising an outer peri area between the extension area and the outer chip area in the first direction, wherein the outer peri area is formed of at least one of an insulating structure and a mold structure.

12. The vertical type nonvolatile memory device of claim 9, wherein the vertical type nonvolatile memory device has a shape separated from a wafer through sawing, the outer chip area is a portion of a scribe lane of the wafer that remains after sawing, the first portion is a portion in which the step key having a rectangular shape formed in the scribe lane remains by sawing, and the alignment vertical channel layers are arranged within the rectangle with a certain arrangement rule.

13. The vertical type nonvolatile memory device of claim 9, wherein the main chip area further comprises a peripheral circuit layer arranged below the substrate.

14. A vertical type nonvolatile memory device comprising:

a main chip area comprising a cell area and an extension area extending from the cell area in a first direction and arranged to have a stepped structure, wherein the cell area and the extension area are formed in a multi-stack structure, which extends on a substrate; and an outer chip area, which surrounds the main chip area and in which a step key is arranged, wherein:

the main chip area comprises a first layer arranged on a substrate and a second layer on the first layer, a lower vertical channel layer connected to the substrate is arranged in the first layer, the step key comprises an alignment vertical channel layer corresponding to the lower vertical channel layer, and a top surface of the alignment vertical channel layer is lower than a top surface of the lower vertical channel layer, the step key is located in a scribe lane portion of the substrate, and the outer chip area comprises an insulating structure of a single material layer on the substrate, the insulating structure has a thickness corresponding to a height of the first vertical channel layer, and the alignment vertical channel layer has a rectangular pillar shape extending vertically from the substrate through the insulating structure.

15. The vertical type nonvolatile memory device of claim 14, wherein the step key further comprises a recessed portion that is a portion other than the alignment vertical channel layer, and the top surface of the alignment vertical channel layer is higher than a bottom surface of the recessed portion by a first step.

16. The vertical type nonvolatile memory device of claim 15, wherein the outer chip area comprises the step key corresponding to the first layer and a key outer area and a mold structure corresponding to the second layer and covering the step key and the key outer area, the mold structure comprises a plurality of sacrificial layers and interlayer insulating layers, which are alternately stacked, and a top surface of the key outer area is higher than the top surface of the alignment vertical channel layer and has a substantially the same height as the top surface of the lower vertical channel layer.

17. The vertical type nonvolatile memory device of claim 14, further comprising an outer peri area between the extension area and the outer chip area in the first direction, wherein the outer peri area is formed of at least one of an insulating structure and a mold structure.

18. The vertical type nonvolatile memory device of claim 14, wherein the vertical type nonvolatile memory device has a chip shape separated from a wafer through sawing, the step key has a shape in which a first step key formed in the scribe lane portion remains by sawing.

19. The vertical type nonvolatile memory device of claim 18, wherein a horizontal cross-section of the first step key has a rectangular shape, and a plurality of alignment vertical channel layers are arranged within the rectangle with a certain arrangement rule.

20. The vertical type nonvolatile memory device of claim 10, wherein the main chip area further comprises a peripheral circuit layer arranged below the substrate.

* * * * *